United States Patent
Chen et al.

(10) Patent No.: US 12,453,165 B2
(45) Date of Patent: Oct. 21, 2025

(54) P-TYPE SEMICONDUCTOR DEVICES WITH DIFFERENT THRESHOLD VOLTAGES AND METHODS OF FORMING THE SAME

(71) Applicant: Taiwan Semiconductor Manufacturing Company, Ltd., Hsin-Chu (TW)

(72) Inventors: Chien-Yuan Chen, Taichung (TW); Kuo-Feng Yu, Hsinchu County (TW); Jian-Hao Chen, Hsinchu (TW); Chih-Yu Hsu, Hsinchu County (TW); Yao-Teng Chuang, Hsinchu (TW); Shan-Mei Liao, Hsinchu (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 607 days.

(21) Appl. No.: 17/832,582

(22) Filed: Jun. 4, 2022

(65) Prior Publication Data
US 2023/0395432 A1  Dec. 7, 2023

(51) Int. Cl.
*H10D 84/03* (2025.01)
*H01L 21/768* (2006.01)
(Continued)

(52) U.S. Cl.
CPC ......... *H10D 84/038* (2025.01); *H10D 30/014* (2025.01); *H10D 30/031* (2025.01);
(Continued)

(58) Field of Classification Search
CPC .. H10D 84/038; H10D 84/83; H10D 84/0144; H10D 30/43; H10D 30/701;
(Continued)

(56) References Cited

U.S. PATENT DOCUMENTS 10,510,620 B1 * 12/2019 Chanemougame ........................ H01L 29/42392
11,495,662 B2 * 11/2022 Liaw .................. H10D 84/0167
(Continued)

FOREIGN PATENT DOCUMENTS

CN   112750828 A   5/2021

OTHER PUBLICATIONS

Koji Kita and Akira Toriumi, Intrinsic Origin of Electric Dipoles Formed at High-k/SiO2 Interface, Dec. 15, 2008, IEEE International Electron Devices Meeting, 2008, San Francisco California.

*Primary Examiner* — Jeff W Natalini
*Assistant Examiner* — Andrew Zabel
(74) *Attorney, Agent, or Firm* — HAYNES AND BOONE, LLP

(57) ABSTRACT

Semiconductor structures and methods are provided. An exemplary method according to the present disclosure includes providing a workpiece comprising a first channel member directly over a first region of a substrate and a second channel member directly over the first channel member, the first channel member being vertically spaced apart from the second channel member, conformally forming a dielectric layer over the workpiece, conformally depositing a dipole material layer over the dielectric layer, after the depositing of the dipole material layer, performing a thermal treatment process to the workpiece, after the performing of the thermal treatment process, selectively removing the dipole material layer, and forming a gate electrode layer over the dielectric layer.

20 Claims, 33 Drawing Sheets

(51) Int. Cl.
*H10D 30/01* (2025.01)
*H10D 30/43* (2025.01)
*H10D 30/67* (2025.01)
*H10D 30/69* (2025.01)
*H10D 62/10* (2025.01)
*H10D 84/01* (2025.01)
*H10D 84/83* (2025.01)

(52) U.S. Cl.
CPC ......... *H10D 30/0415* (2025.01); *H10D 30/43* (2025.01); *H10D 30/6735* (2025.01); *H10D 30/6757* (2025.01); *H10D 30/701* (2025.01); *H10D 62/121* (2025.01); *H10D 84/0144* (2025.01); *H10D 84/83* (2025.01); *H01L 21/76864* (2013.01)

(58) Field of Classification Search
CPC ............ H10D 30/014; H10D 30/6735; H10D 62/121; H10D 62/85; H10D 62/824; H10D 62/852; H10D 62/854; H10D 62/8503; H10D 62/881; H10D 62/119; H10D 62/122; H10D 62/123; H10D 62/118; H10D 62/812; H10D 62/813; H10D 62/814; H10D 62/815; H10D 62/8161; H10D 62/8162; H10D 62/8163; H10D 62/8164; H10D 62/8171; H10D 62/8181; H10D 30/6757; H10D 30/0415; H10D 30/031; H10D 30/051; H10D 30/0512; H10D 30/0515; H10D 30/0516; H10D 30/021; H10D 30/026; H10D 30/501; H10D 30/502; H10D 30/503; H10D 30/504; H10D 30/506; H10D 30/507; H10D 30/508; H10D 30/509; H10D 30/674; H10D 30/019; H10D 30/0191; H10D 30/0193; H10D 30/0194; H10D 30/0195; H10D 30/0196; H10D 30/0197; H10D 30/0198; H10D 30/6212; H10D 30/6213; H10D 30/6215; H10D 30/6217; H10D 30/6218; H10D 30/6219; H10D 30/6748; H01L 21/76864
See application file for complete search history.

(56) References Cited

U.S. PATENT DOCUMENTS

| | | | | |
|---|---|---|---|---|
| 11,615,962 | B2 * | 3/2023 | Hsu | H01L 29/78696 257/351 |
| 11,948,987 | B2 * | 4/2024 | Chu | H01L 29/0847 |
| 2020/0350414 | A1 * | 11/2020 | Lee | H01L 21/32135 |
| 2021/0057544 | A1 * | 2/2021 | Lin | H01L 29/78696 |
| 2021/0098456 | A1 | 4/2021 | Huang et al. | |
| 2021/0134794 | A1 * | 5/2021 | Huang | H01L 29/78696 |
| 2021/0225839 | A1 * | 7/2021 | Lin | H01L 21/823431 |
| 2021/0265496 | A1 * | 8/2021 | Chu | H01L 21/32051 |
| 2021/0359142 | A1 * | 11/2021 | Huang | H01L 21/02236 |
| 2021/0366783 | A1 * | 11/2021 | Chu | H10D 30/024 |
| 2021/0375629 | A1 * | 12/2021 | Lai | H01L 21/3115 |
| 2021/0384313 | A1 * | 12/2021 | Cheng | H01L 21/823462 |
| 2021/0391439 | A1 * | 12/2021 | Pao | H10D 84/038 |
| 2021/0408259 | A1 * | 12/2021 | Cheng | H01L 21/28088 |
| 2022/0059533 | A1 * | 2/2022 | Bae | H01L 29/42392 |
| 2022/0093597 | A1 * | 3/2022 | Ouellette | H01L 29/42392 |
| 2022/0093648 | A1 * | 3/2022 | Lavric | H01L 29/66439 |
| 2022/0230923 | A1 * | 7/2022 | More | H01L 29/78696 |
| 2022/0320293 | A1 * | 10/2022 | Liao | H01L 29/775 |
| 2023/0261074 | A1 * | 8/2023 | Bao | H01L 29/775 257/288 |
| 2023/0290778 | A1 * | 9/2023 | Lavric | H10D 84/038 |
| 2023/0290852 | A1 * | 9/2023 | Lavric | H01L 29/517 |
| 2024/0363424 | A1 * | 10/2024 | Wu | H10D 84/834 |

\* cited by examiner

P-TYPE SEMICONDUCTOR DEVICES WITH DIFFERENT THRESHOLD VOLTAGES AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors (both also referred to as non-planar transistors) are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). Compared to planar transistors, such configuration provides better control of the channel and drastically reduces SCEs (in particular, by reducing sub-threshold leakage (i.e., coupling between a source and a drain of the FinFET in the "off" state)). A GAA transistor has a gate structure that can extend, partially or fully, around a channel region to provide access to the channel region on two or more sides. The channel region of the GAA transistor may be formed from nanowires, nanosheets, other nanostructures, and/or other suitable structures.

IC devices include transistors that serve different functions, such as input/output (I/O) functions and core functions. These different functions require the transistors to have different characteristics, such as different threshold voltages. Although existing GAA transistors and processes are generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
FIG. 1 is a flowchart illustrating a method of forming a semiconductor structure, according to various embodiments of the present disclosure.
Figure 1:
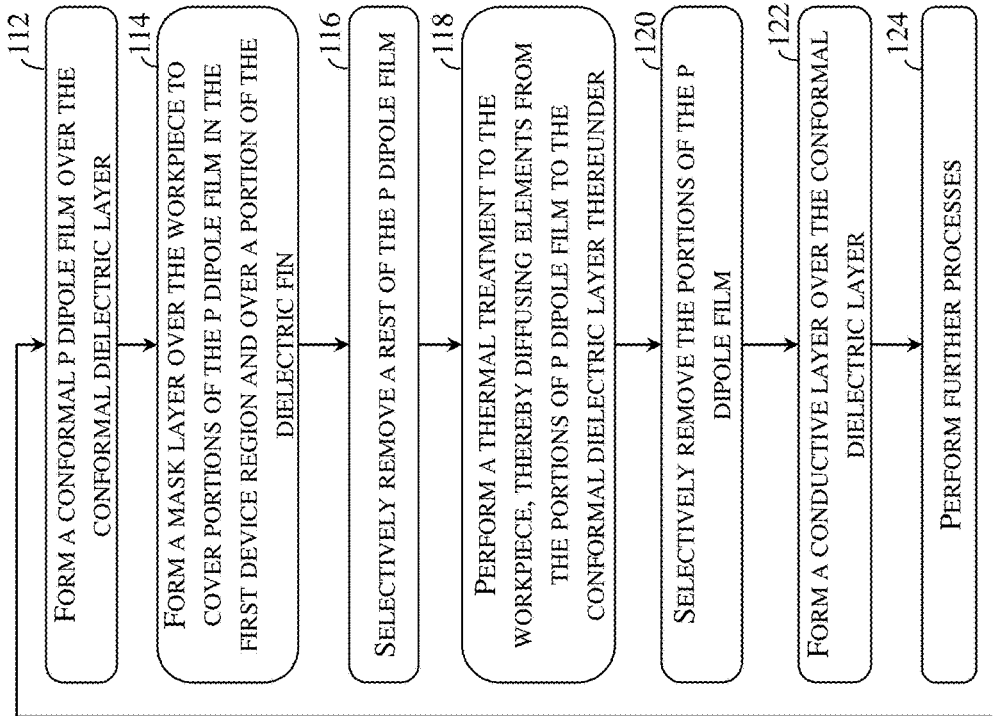
Figure 1:
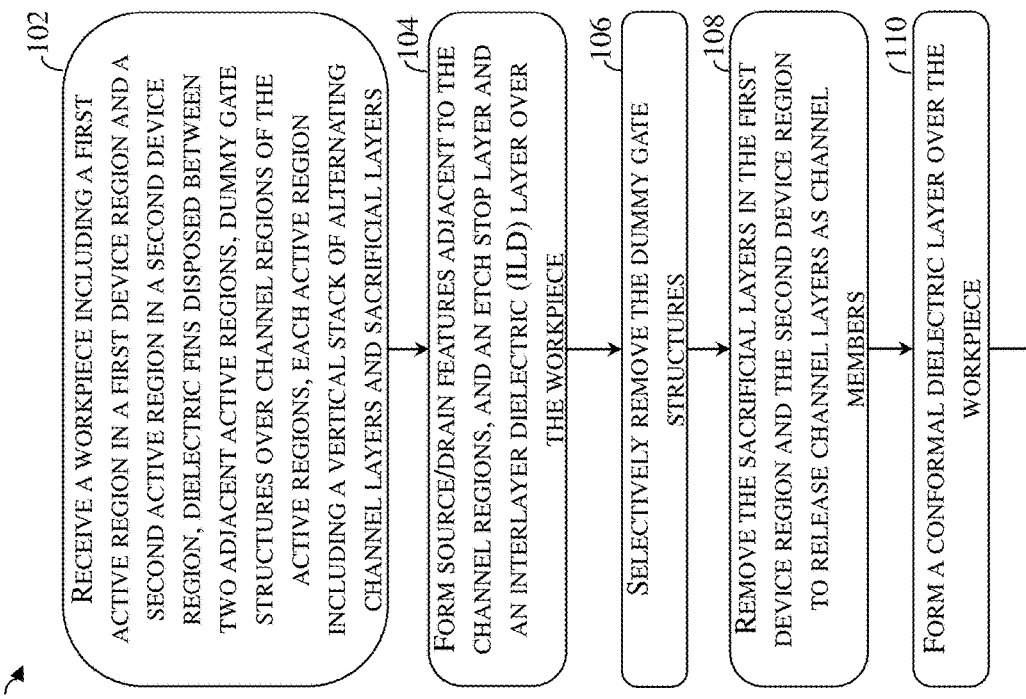

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure relates to p-type GAA transistors and methods of forming the same. A method according to embodiments of the present disclosure includes forming a gate dielectric layer over a first device region and a second device region of a workpiece, forming a p dipole layer over the gate dielectric layer, forming a hard mask layer such as TiN over the p dipole layer, where the combination of the gate dielectric layer, the p dipole layer, and the hard mask layer substantially fills the gaps between two vertically adjacent nanostructures. The hard mask layer may be then patterned to over only a portion of the p dipole layer over the first device region, a rest of or a remaining portion of the p dipole layer not covered by the hard mask layer may be selectively removed. An annealing process may be then performed to thermally drive elements in the p dipole layer into the portion of the gate dielectric layer thereunder. As such, the composition of the portion of the gate dielectric layer over the first device region is different from that of the portion of the gate dielectric layer over the second device region. Therefore, the workpiece provides p-type transistors with different threshold voltages.

Figure 20:
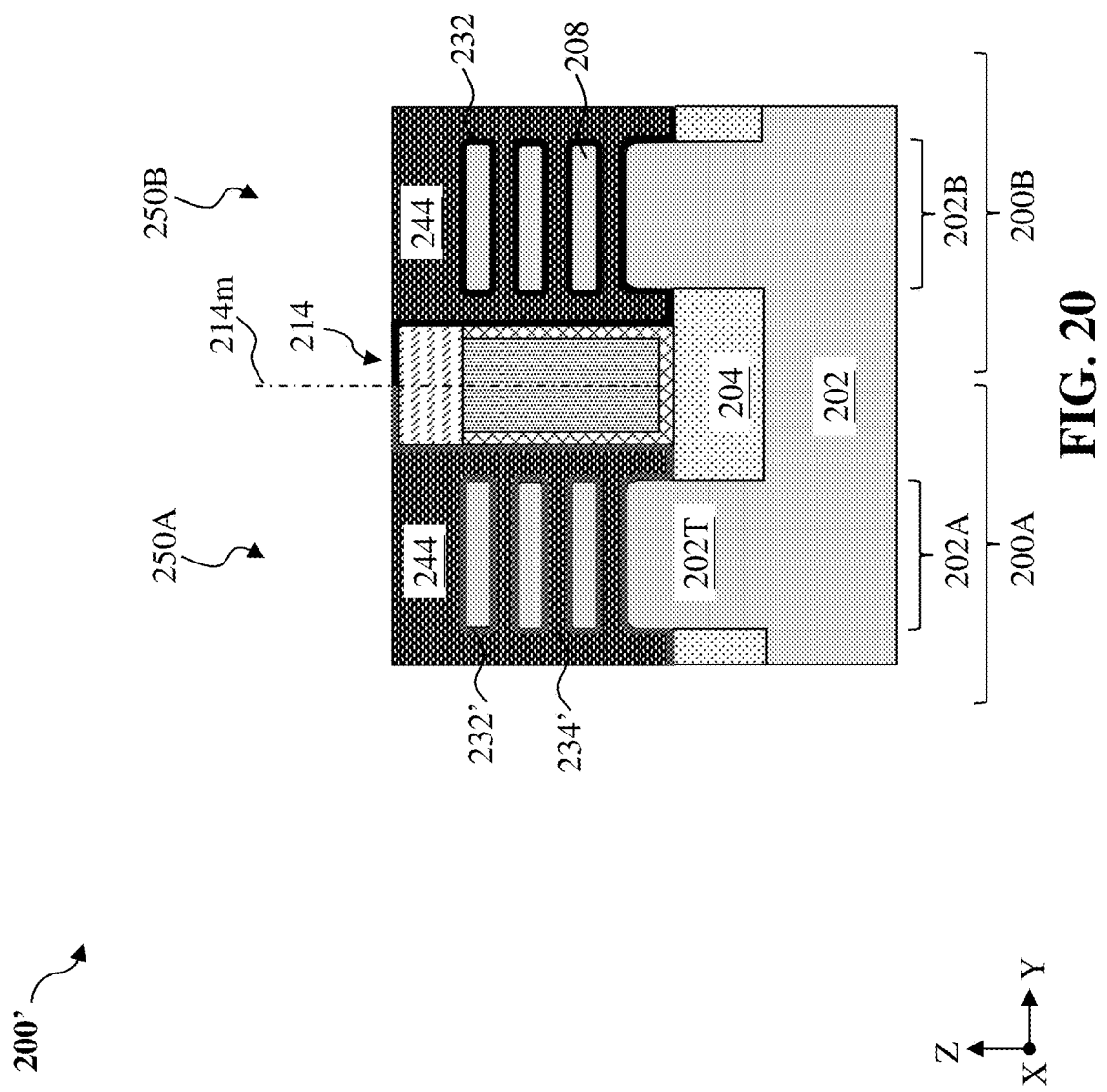
Figure 21:
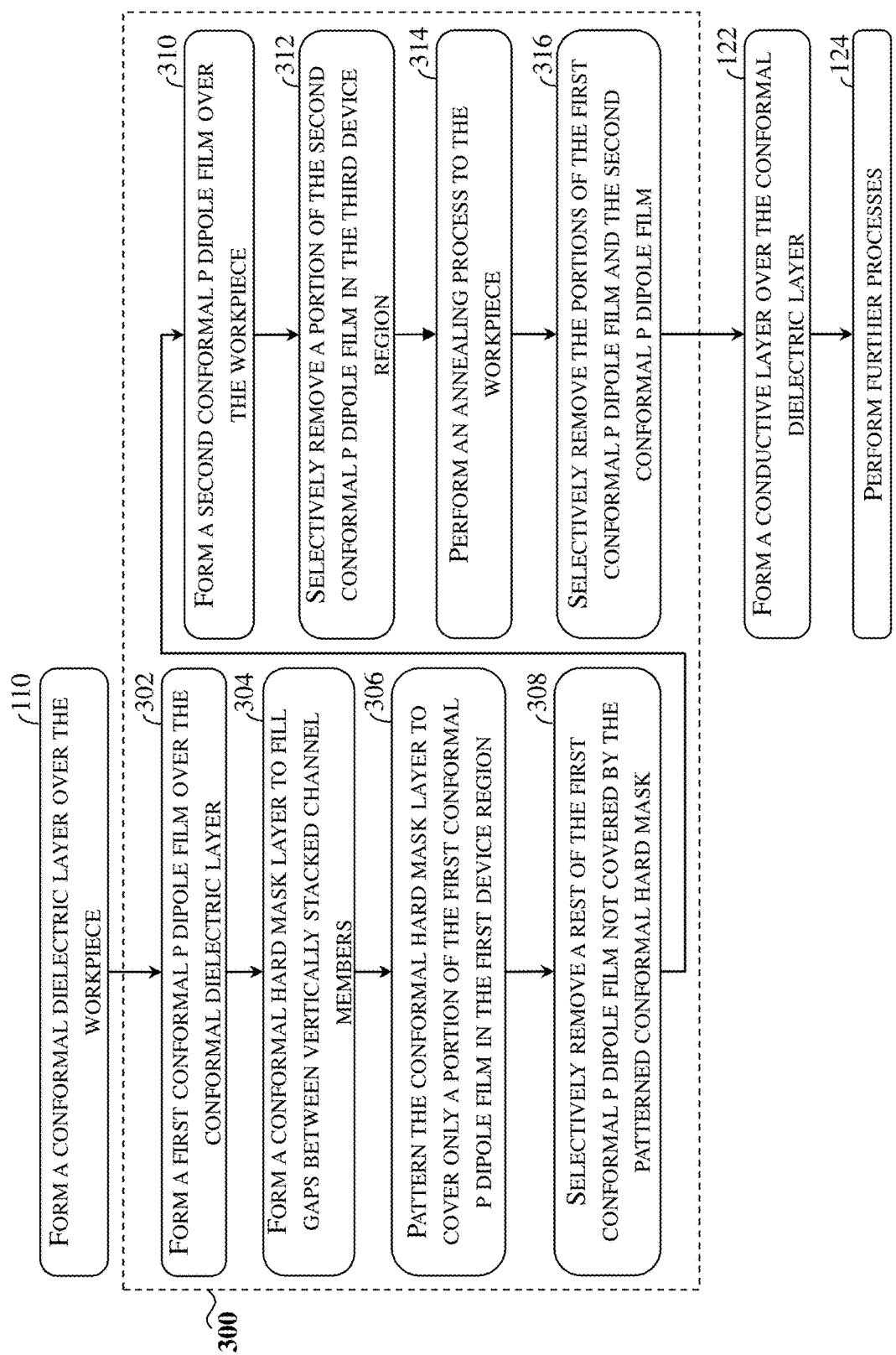
FIG. 21 is a flowchart illustrating another method of forming a semiconductor structure, according to various embodiments of the present disclosure.

The various aspects of the present disclosure will now be described in more detail with reference to the figures. In that regard, FIG. 1 is a flowchart illustrating method 100 of forming a semiconductor structure according to embodiments of the present disclosure. Method 100 is described below in conjunction with FIGS. 2-20, which are fragmentary cross-sectional views or top views of a workpiece 200 or workpiece 200' at different stages of fabrication according to embodiments of method 100. FIG. 21 includes a flowchart illustrating a method 300 of forming a semiconductor structure according to embodiments of the present disclosure. Method 300 is described below in conjunction with FIGS. 22-33, which are fragmentary cross-sectional views of a workpiece 400 at different stages of fabrication according to embodiments of method 300. Methods 100 and 300 are merely examples and are not intended to limit the present disclosure to what is explicitly illustrated therein. Additional steps may be provided before, during and after the method 100 and/or method 300, and some steps described can be replaced, eliminated, or moved around for additional embodiments of the method. Not all steps are described herein in detail for reasons of simplicity. Because the workpiece 200/200'/400 will be fabricated into a semiconductor structure 200/200'/400 upon conclusion of the fabrication processes, the workpiece 200/200'/400 may be referred to as the semiconductor structure 200/200'/400 as the context requires. For avoidance of doubts, the X, Y and Z directions in the figures are perpendicular to one another and are used consistently. Throughout the present disclosure, like reference numerals denote like features unless otherwise excepted.

Referring to FIGS. 1, 2, 3 and 4, method 100 includes a block 102 where a workpiece 200 is received. The workpiece 200 may include a multi-level/multi-mode threshold voltage (Vt) region. To accommodate different specifications, transistors in the multi-level/multi-mode threshold voltage (Vt) region may be configured to serve different functions (e.g., working in a power saving mode, a standard mode, or a high-performance mode) and have different threshold voltages. In an embodiment, the multi-level/multi-mode threshold voltage (Vt) region may include a low threshold voltage (LVt) region, a standard threshold voltage (SVt) region, and a high threshold voltage (HVt) region. In the present embodiments, the workpiece 200 includes a three-level/three-mode threshold voltage (Vt) region that is formed of a device region 200A, a device region 200B, and a device region 200C. The device regions 200A, 200B, and 200C are device areas that may include transistors having different threshold voltages.

Figure 3:
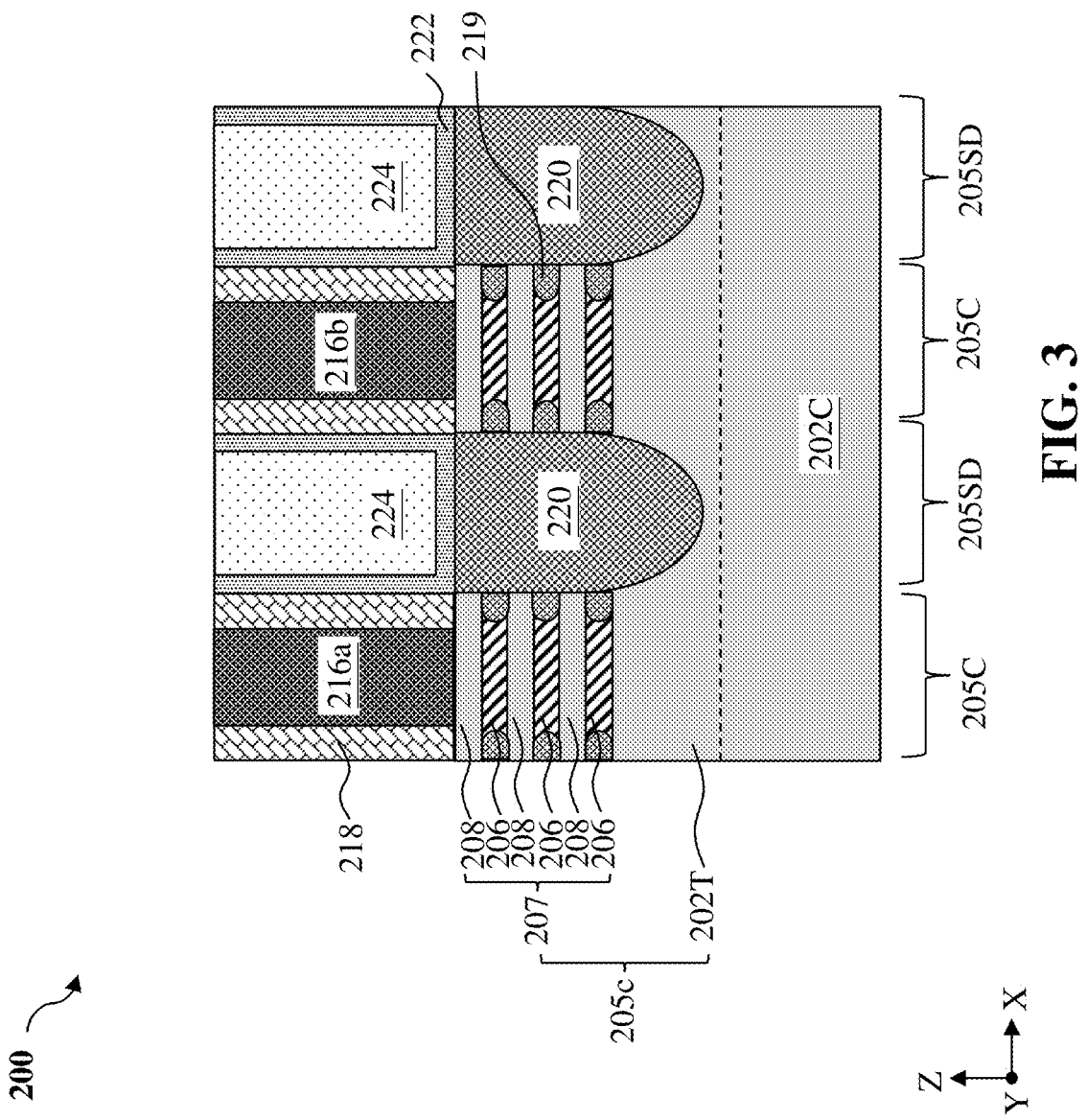
FIG. 3 illustrates a fragmentary cross-sectional view of the workpiece taken along line A-A' as shown in FIG. 2 during various fabrication stages in the method of FIG. 1, according to various aspects of the disclosure.
Figure 4:
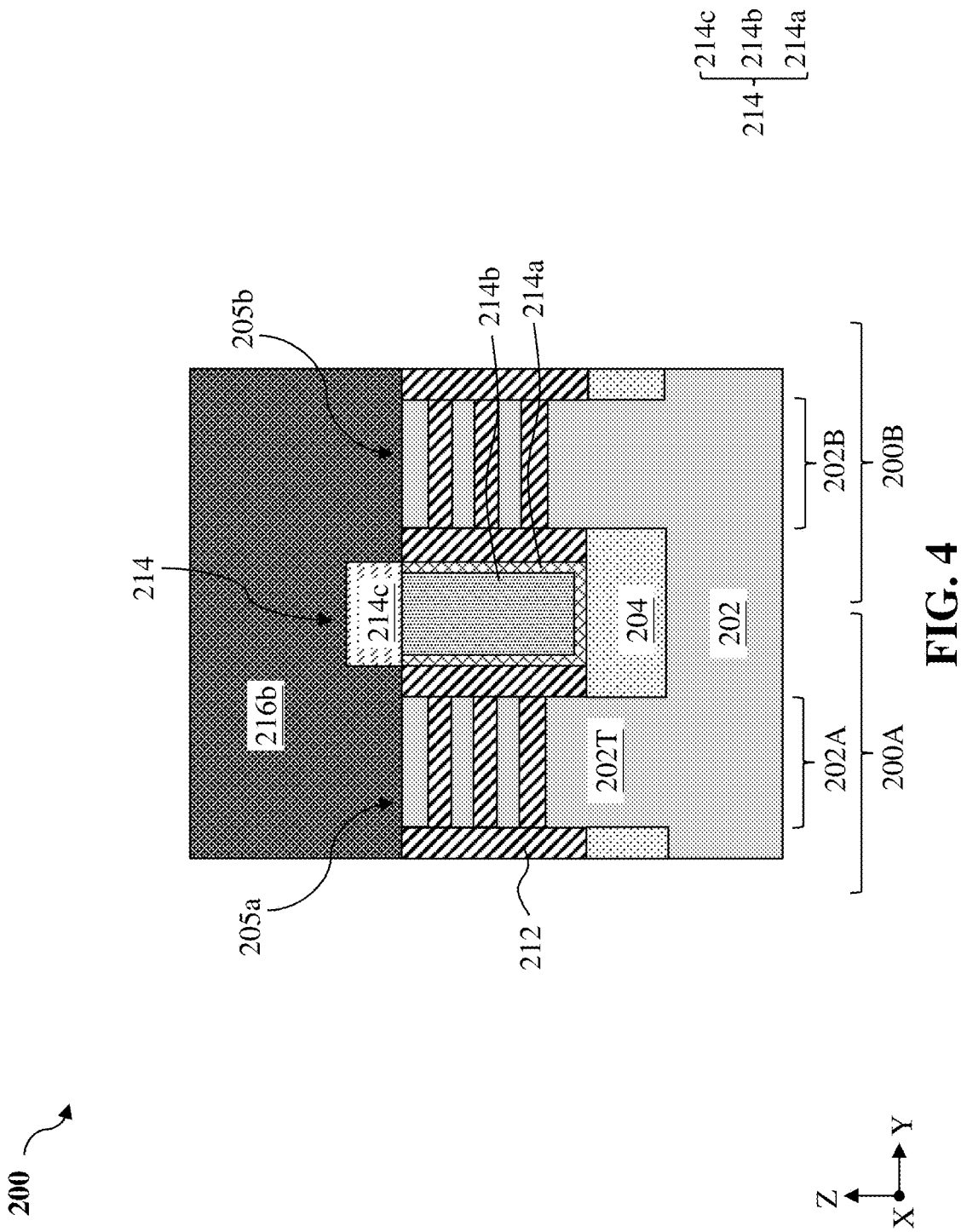
FIGS. 4, 5, 6, 7, 8, 9, 10, 11, 12, 13, 14, 15, 16, 17, 18, 19, and 20 illustrate fragmentary cross-sectional views of the workpiece taken along line B-B' as shown in FIG. 2 during various fabrication stages in the method of FIG. 1, according to various aspects of the disclosure.

The workpiece 200 includes a substrate 202 (shown in FIGS. 3-4). In an embodiment, the substrate 202 is a bulk silicon substrate (i.e., including bulk single-crystalline silicon). The substrate 202 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 202 may be a semiconductor-on-insulator substrate, such as a silicon-on-insulator (SOI) substrate, a silicon germanium-on-insulator substrate, or a germanium-on-insulator substrate, and includes a carrier, an insulator on the carrier, and a semiconductor layer on the insulator. The substrate 202 can include various doped regions configured according to design requirements of semiconductor structure 200. P-type doped regions may include p-type dopants, such as boron, indium, other p-type dopant, or combinations thereof. N-type doped regions may include n-type dopants, such as phosphorus, arsenic, other n-type dopant, or combinations thereof. In some implementations, the substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions. In the present embodiments, the workpiece 200 will be fabricated into p-type GAA devices formed over n-type wells (not explicitly shown) in the substrate 202.

The workpiece 200 also includes multiple fin-shaped active regions (e.g., fin-shaped active regions 205a, 205b and 205c) disposed over the substrate 202. In the present embodiments, the fin-shaped active region 205a is formed in the device region 200A (shown in FIG. 2) of the workpiece 200 and directly over a portion 202A (shown in FIG. 4) of the substrate 202, the fin-shaped active region 205b is formed in the device region 200B of the workpiece 200 and directly over a portion 202B of the substrate 202, and the fin-shaped active region 205c is formed in the device region 200C of the workpiece 200 and directly over a portion 202C (shown in FIGS. 3 and 21) of the substrate 202. The fin-shaped active regions 205a, 205b, 205c may be separately or collectively referred to as a fin-shaped active region 205 or fin-shaped active regions 205. Each of the fin-shaped active regions 205 extends lengthwise along the X direction and is divided into channel regions 205C and source/drain regions 205SD. Source/drain region(s) may refer to a source or a drain, individually or collectively dependent upon the context.

The fin-shaped active regions 205 may be formed from a top portion 202T of the substrate 202 and a vertical stack 207 (shown in FIG. 3) of alternating semiconductor layers 206 and 208 using a combination of lithography and etch steps. In the depicted embodiment, the vertical stack 207 of alternating semiconductor layers 206 and 208 includes a number of channel layers 208 interleaved by a number of sacrificial layers 206. Each channel layer 208 may include a semiconductor material such as, silicon, germanium, silicon carbide, silicon germanium, GeSn, SiGeSn, SiGeCSn, other suitable semiconductor materials, or combinations thereof, while each sacrificial layer 206 has a composition different from that of the channel layer 208. In an embodiment, the channel layer 208 includes silicon (Si), the sacrificial layer 206 includes silicon germanium (SiGe). The channel layers 208 and the sacrificial layers 206 may be epitaxially deposited on the substrate 202 using molecular beam epitaxy (MBE), vapor-phase epitaxy (VPE), ultra-high vacuum CVD (UHV-CVD), and/or other suitable epitaxial growth processes. In some examples, each of the fin-shaped active regions 205 may include a total of three to ten pairs of alternating sacrificial layers 206 and channel layers 208; of course, other configurations may also be applicable depending upon specific design requirements. In alternative embodiments where fin-type field effect transistors (FinFETs) are desired, the fin-shaped active regions 205 may include a uniform semiconductor composition along the Z direction and may be free of the vertical stack 207 as depicted herein.

The workpiece 200 may also include an isolation feature 204 (shown in FIG. 4) formed around the fin-shaped active regions 205 to isolate two adjacent fin-shaped active regions. The isolation feature 204 may also be referred to as a shallow trench isolation (STI) feature. In some embodiments, the STI feature 204 may include silicon oxide, silicon oxynitride, fluorine-doped silicate glass (FSG), a low-k dielectric, combinations thereof, and/or other suitable materials.

The workpiece 200 also includes cladding layers 212 extending along sidewall surfaces of each fin-shaped active region 205. In some embodiments, the cladding layer 212 may have a composition that is substantially the same as that of the sacrificial layer 206, such that they may be selectively removed by a common etching process. In the present embodiments, the cladding layer 212 is formed of SiGe.

Figure 2:
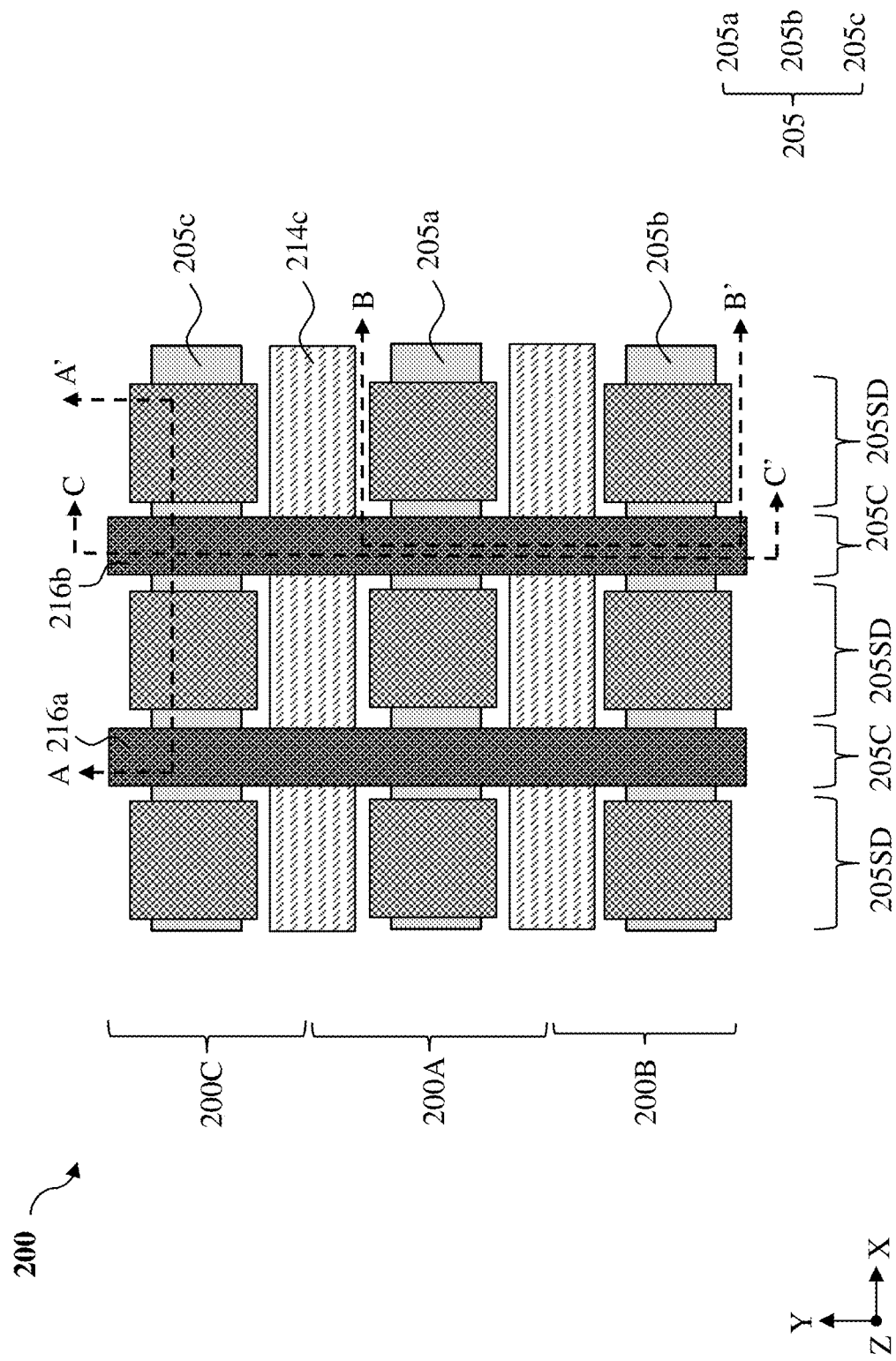
FIG. 2 illustrates a fragmentary top view of an exemplary workpiece to undergo various stages of operations in the method of FIG. 1, according to various aspects of the disclosure.

Still referring to FIGS. 2, 3 and 4, the workpiece 200 also includes a hybrid fin 214 formed over the STI feature 204 and between two adjacent fin-shaped active regions 205. The hybrid fin 214 is spaced apart from the fin-shaped active regions 205 by the cladding layers 212. In some embodiments, the hybrid fin 214 may be a single-layer structure. In some other embodiments, the hybrid fin 214 may include a multi-layer structure. For example, as shown in FIG. 4, the hybrid fin 214 includes a dielectric layer 214b embedded in a dielectric layer 214a. The dielectric layer 214a may include silicon nitride, silicon carbon nitride (SiCN), silicon oxycarbonitride (SiOCN), or other suitable materials. In an embodiment, the dielectric layer 214a is formed of silicon carbon nitride. In an embodiment, the dielectric layer 214b is formed of silicon oxide. The hybrid fin 214 also includes a helmet layer 214c formed over the dielectric layers 214a-214b. The helmet layer 214c may be a high-k dielectric layer and may include silicon nitride, aluminum oxide, aluminum nitride, aluminum oxynitride, zirconium oxide, zirconium nitride, zirconium aluminum oxide, hafnium oxide, other high-k material, or a suitable dielectric material. In some examples, the helmet layer 214c may be configured to divide a gate stack into multiple portions by itself or along with a gate cut feature disposed over the hybrid fin 214.

Still referring to FIGS. 2, 3 and 4, the workpiece 200 also includes dummy gate structures 216a and 216b formed over channel regions 205C of the fin-shaped active regions 205. In some embodiments, the dummy gate structures 216a and 216b may share substantially the same composition and dimension. The channel regions 205C and the dummy gate structures 216a and 216b also define source/drain regions 205SD that are not vertically overlapped by the dummy gate structures 216a and 216b. Each of the channel regions 205C is disposed between two source/drain regions 205SD along the X direction. Two dummy gate structures are shown in FIGS. 2 and 3 but the workpiece 200 may include other numbers of dummy gate structures. In this embodiment, a gate replacement process (or gate-last process) is adopted where the dummy gate structures 216a and 216b serve as placeholders for functional gate stacks. Other processes for forming the functional gate stacks are possible. In the present embodiments, although not separately shown, each of the dummy gate structures 216a and 216b includes a dummy gate dielectric layer (e.g., silicon oxide) and a dummy gate electrode (e.g., polysilicon) disposed over the dummy gate dielectric layer. As discussed in detail below, the dummy gate structures 216a and 216b are configured to be replaced with a respective functional gate stack.

Still referring to FIG. 3, the workpiece 200 also includes gate spacers 218 extending along sidewalls of the dummy gate structures 216a and 216b. In some embodiments, the gate spacers 218 may include silicon oxide, silicon oxycarbide, silicon carbonitride, silicon oxycarbonitride, silicon nitride, zirconium oxide, aluminum oxide, or a suitable dielectric material. The gate spacers 218 may be a single-layer structure or a multi-layer structure. Additionally, the workpiece 200 also includes inner spacer features 219 disposed between two adjacent channel layers 208 and in direct contact with the sacrificial layers 206 in the channel regions 205C. The inner spacer features 219 may include silicon nitride, silicon oxycarbonitride, silicon carbonitride, silicon oxide, silicon oxycarbide, silicon carbide, silico oxynitride, other suitable materials, or combinations thereof.

Referring to FIGS. 1, 2, 3, and 4, method 100 includes a block 104 where source/drain features 220 are formed adjacent to the channel regions 205C, a contact etch stop layer (CESL) 222 and an interlayer dielectric (ILD) layer 224 are formed over the source/drain features 220. The source/drain features 220 are formed in and/or over source/drain regions 205SD and coupled to the channel layers 208 in the channel regions 205C. In the present embodiments, the source/drain features 220 are p-type source/drain features. Exemplary p-type source/drain features may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process.

Still referring to FIG. 3, a contact etch stop layer (CESL) 222 and an interlayer dielectric (ILD) layer 224 are formed over the workpiece 200. The CESL 222 is configured to protect the various underlying components during subsequent fabrication processes and may include silicon nitride, silicon oxynitride, and/or other suitable materials and may be formed by ALD, chemical vapor deposition (CVD), plasma-enhanced chemical vapor deposition (PECVD) process and/or other suitable deposition or oxidation processes. As shown in FIG. 3, the CESL 222 may be formed on top surfaces of the source/drain features 220 and sidewalls of the gate spacers 218. The ILD layer 224 is deposited by a CVD process, a PECVD process or other suitable deposition technique over the workpiece 200 after the depositing of the CESL 222. The ILD layer 224 may include silicon oxide, a low-k dielectric material, tetraethyl orthosilicate (TEOS), doped silicon oxide (e.g., BPSG, FSG, PSG, BSG, etc.), other suitable dielectric materials, or combinations thereof.

One or more chemical mechanical planarization (CMP) processes may be performed to planarize the top surface of the workpiece 200 after the depositing of the CESL 222 and the ILD layer 224.

Figure 5:
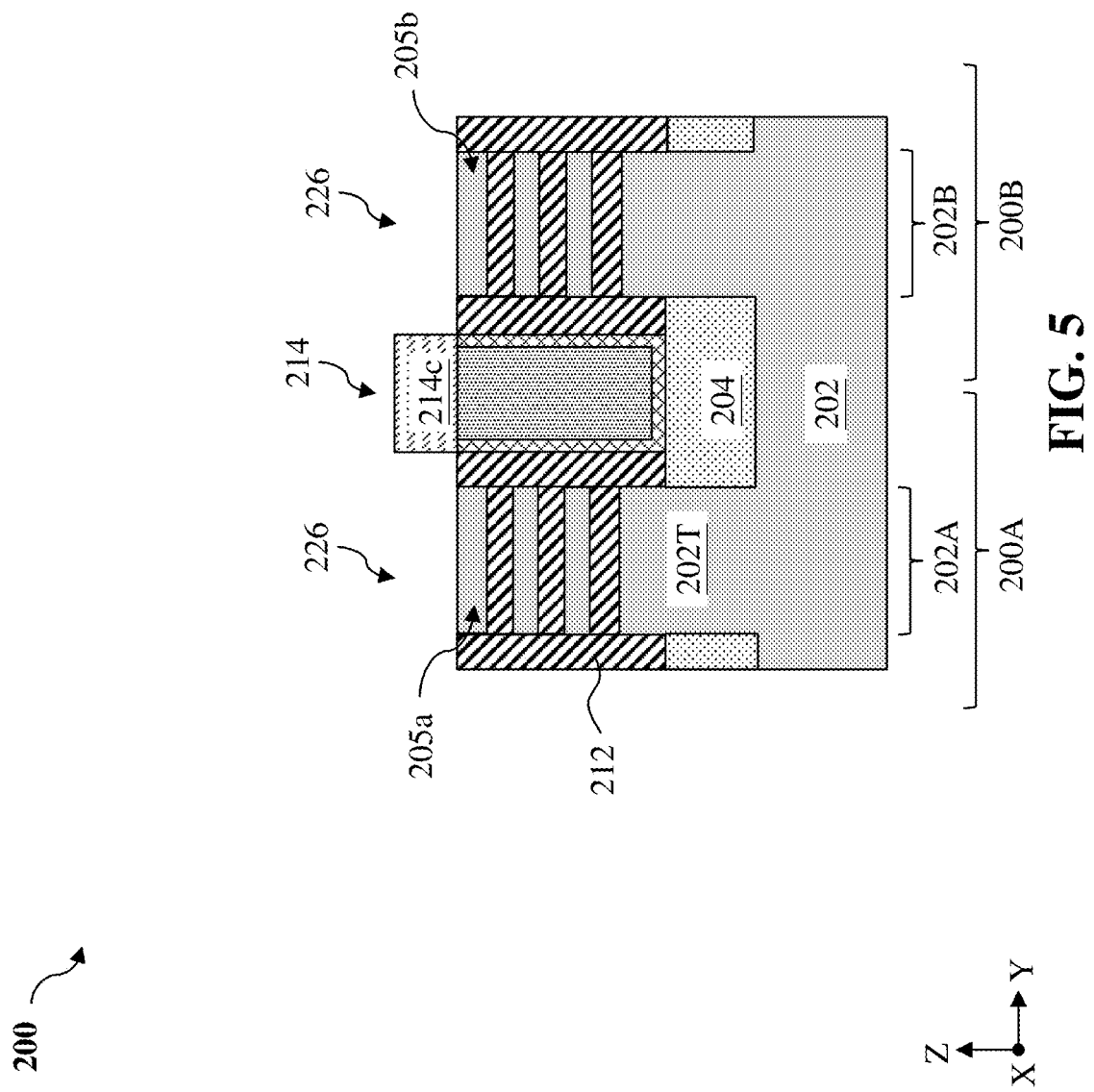

Referring to FIGS. 1 and 5, method 100 includes a block 106 where the dummy gate structures 216a-216b are selectively removed to form gate trenches 226 over the channel regions 205C. The dummy gate structures 216a-216b are selectively removed by an etching process. The etching process for removing the dummy gate structures 216a-216b may include any suitable process, such as a dry etching process, a wet etching process, or combinations thereof, and is configured to selectively remove the dummy gate structures 216a-216b without substantially etching the channel layers 208, the sacrificial layers 206, the gate spacers 218, the hybrid fin 214, the CESL 222, and the ILD layer 224.

Figure 6:
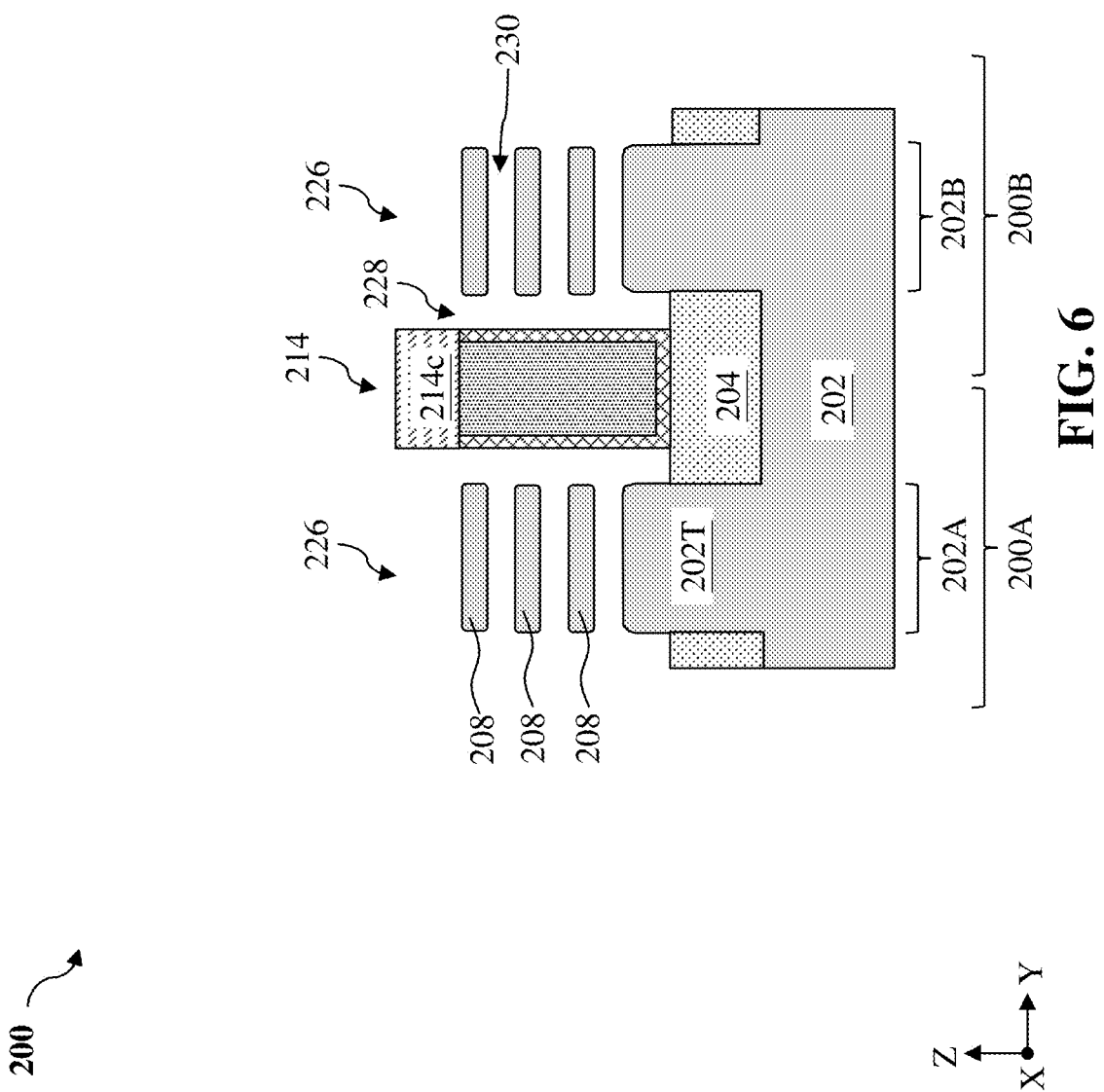

Referring to FIGS. 1 and 6, method 100 includes a block 108 where the sacrificial layers 206 are selectively removed to release the channel layers 208 as channel members 208. After the selective removal of the dummy gate structures 216a-216b, without substantially removing the channel layers 208, one or more etching processes may be performed to selectively remove the cladding layers 212 and the sacrificial layers 206 to release the channel layers 208 as channel members 208. Since the composition of the cladding layers 212 is the same as the composition of the sacrificial layers 206, the cladding layers 212 and the sacrificial layers 206 may be removed by a common etching process. In one example, the etching process for removing the sacrificial layers 206 may be a wet etching process that employs an oxidant such as ammonium hydroxide ($NH_4OH$), ozone ($O_3$), nitric acid ($HNO_3$), hydrogen peroxide ($H_2O_2$), other suitable oxidants, and a fluorine-based etchant such as hydrofluoric acid (HF), ammonium fluoride ($NH_4F$), other suitable etchants, or combinations thereof. The removal of the cladding layers 212 forms trenches 228 between the stack of channel members 208 and the hybrid fin 214, and the removal of the sacrificial layers 206 forms openings 230.

Figure 7:
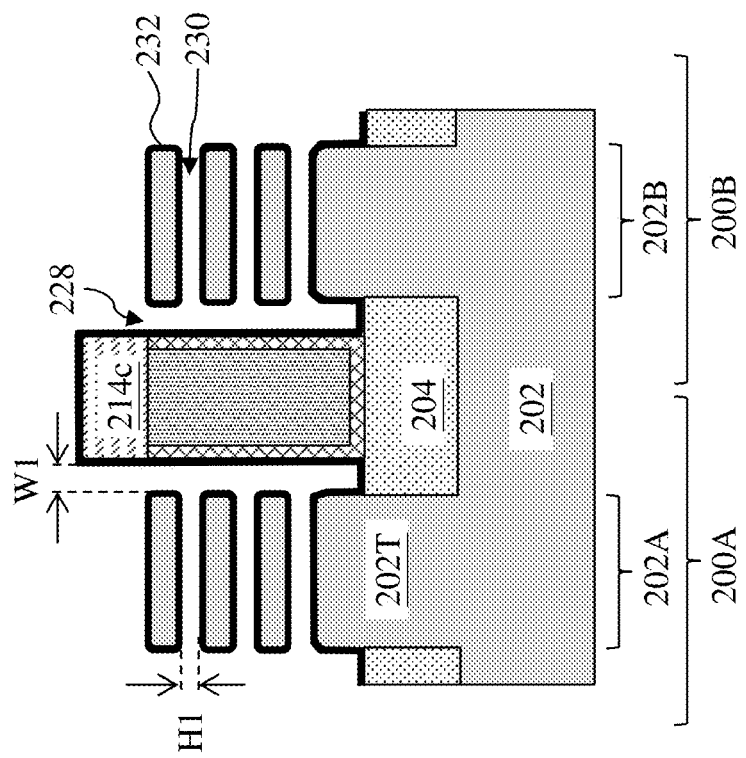

Referring to FIGS. 1 and 7, method 100 includes a block 110 where a gate dielectric layer 232 is formed over the workpiece 200. In some embodiments, before forming the gate dielectric layer 232, an interfacial layer may be deposited in the gate trenches 226, the trenches 228 and the openings 230. In some implementations, the interfacial layer may include silicon oxide and may be formed by thermal oxidization. In an embodiment, the gate dielectric layer 232 is conformally deposited over the workpiece 200 by performing a deposition process (e.g., CVD, ALD) to have a generally uniform thickness over the top surface of the workpiece 200 to partially fill the trenches 226 and 228, and openings 230. The term "conformally" may be used herein for ease of description of a layer having substantially uniform thickness over various regions. The gate dielectric layer 232 may include dielectric materials having a high dielectric constant, for example, greater than a dielectric constant of silicon oxide (k~ 3.9). Exemplary high-k dielectric materials include hafnium, zirconium, tantalum, titanium, oxygen, nitrogen, other suitable constituent, or combinations thereof. In some implementations, the gate dielectric layer 232 may include a high-k dielectric material including, for example, $HfO_2$, HfSiO, HfSiON, HfTaO, HfTiO, HfZrO, $ZrO_2$, $TiO_2$, $Ta_2O_5$, other suitable high-k dielectric material, or combinations thereof. After the depositing of the gate dielectric layer 232, the trenches 228 and the openings 230 are partially filled by the gate dielectric layer 232. More specifically, after the depositing of the gate dielectric layer 232, each opening 230 spans a height H1 along the Z direction, and each trench 228 spans a width W1 along the Y direction.

Figure 8:
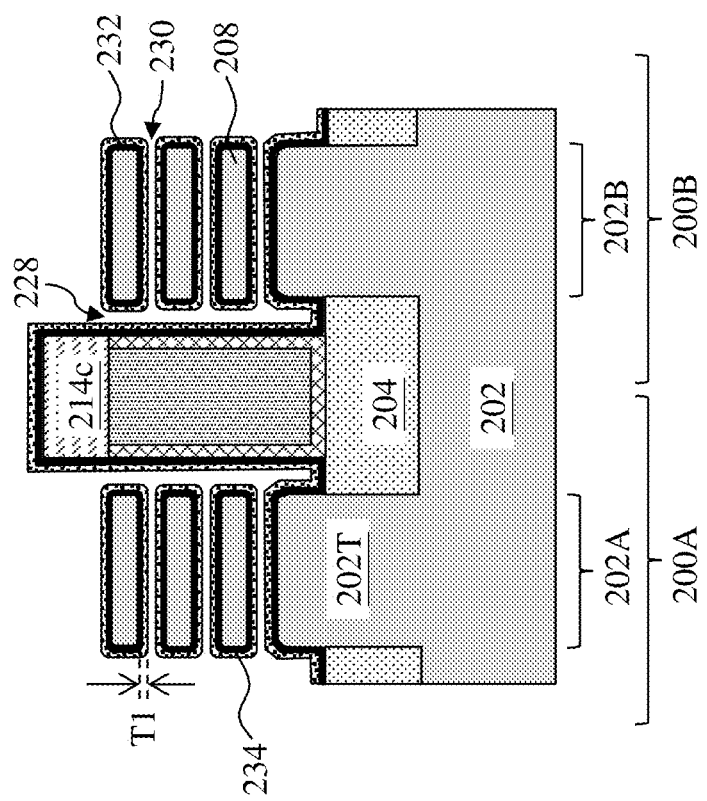

Referring to FIGS. 1 and 8, method 100 includes a block 112 where a p dipole film 234 is conformally deposited over the gate dielectric layer 232. As used herein, a p dipole film generally refers to a dielectric film having a metal element that, when diffusing into a gate dielectric layer, can induce a dipole tending to lower a threshold voltage of the to-be-formed p-type transistor. In an embodiment, the p dipole film 234 is conformally deposited over the workpiece 200 to have a generally uniform thickness T1 over the top surface of the workpiece 200. In some embodiments, the p dipole film 234 may be formed of gallium oxide, zinc oxide, or aluminum oxide and may be deposited using atomic layer deposition (ALD). In one embodiment, the p dipole film 234 may be formed of gallium oxide. In the present embodiments, after the depositing of the p dipole film 234, the trenches 226 and 228, and openings 230 are still partially filled. That is, the thickness T1 is less than a half of the height H1 and is less than a half of the width W1. In other words, a ratio of the thickness T1 to the height H1 is less than 0.5, and a ratio of the thickness T1 to the width W1 is less than 0.5.

Figure 9:
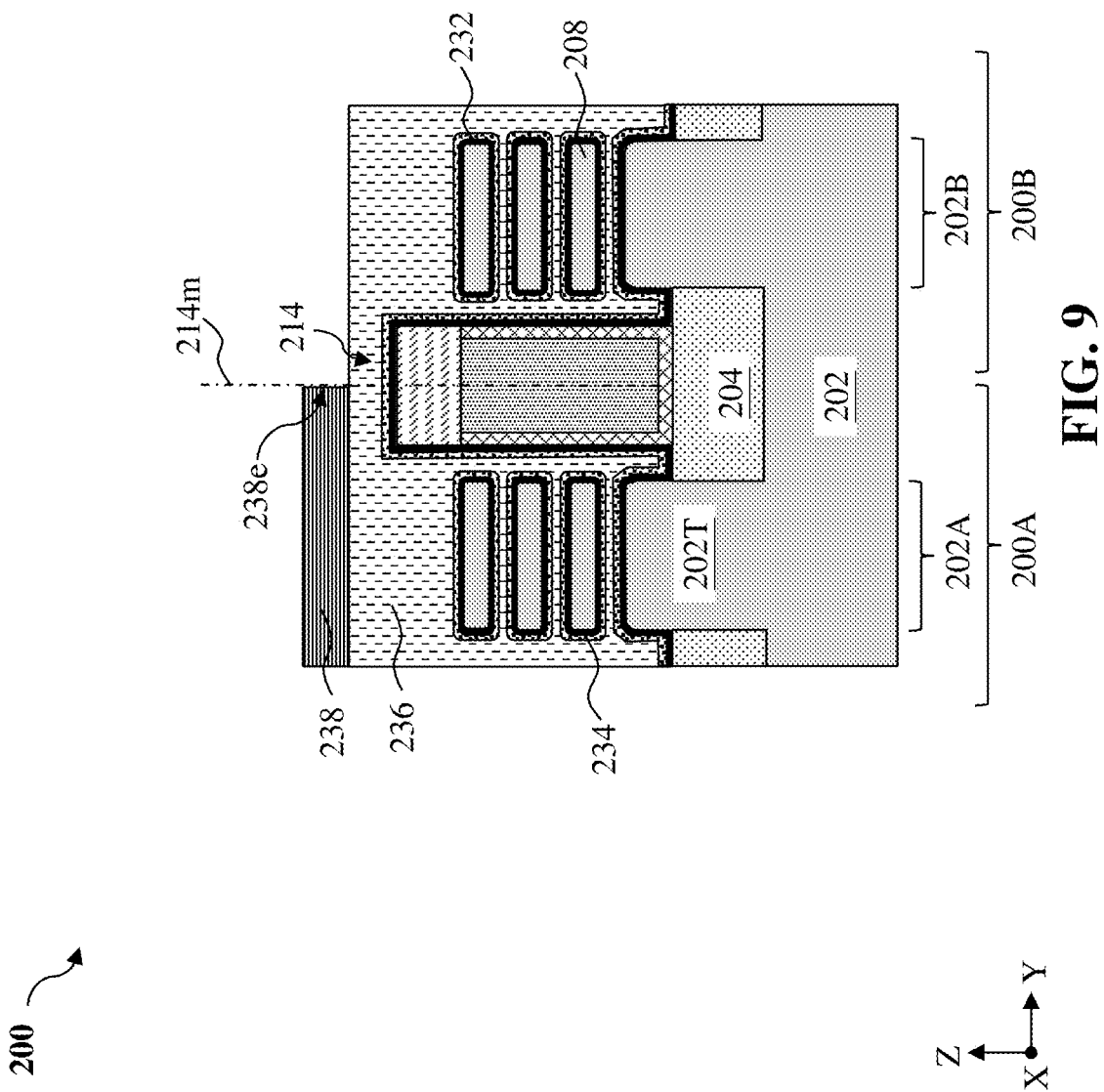
Figure 10:
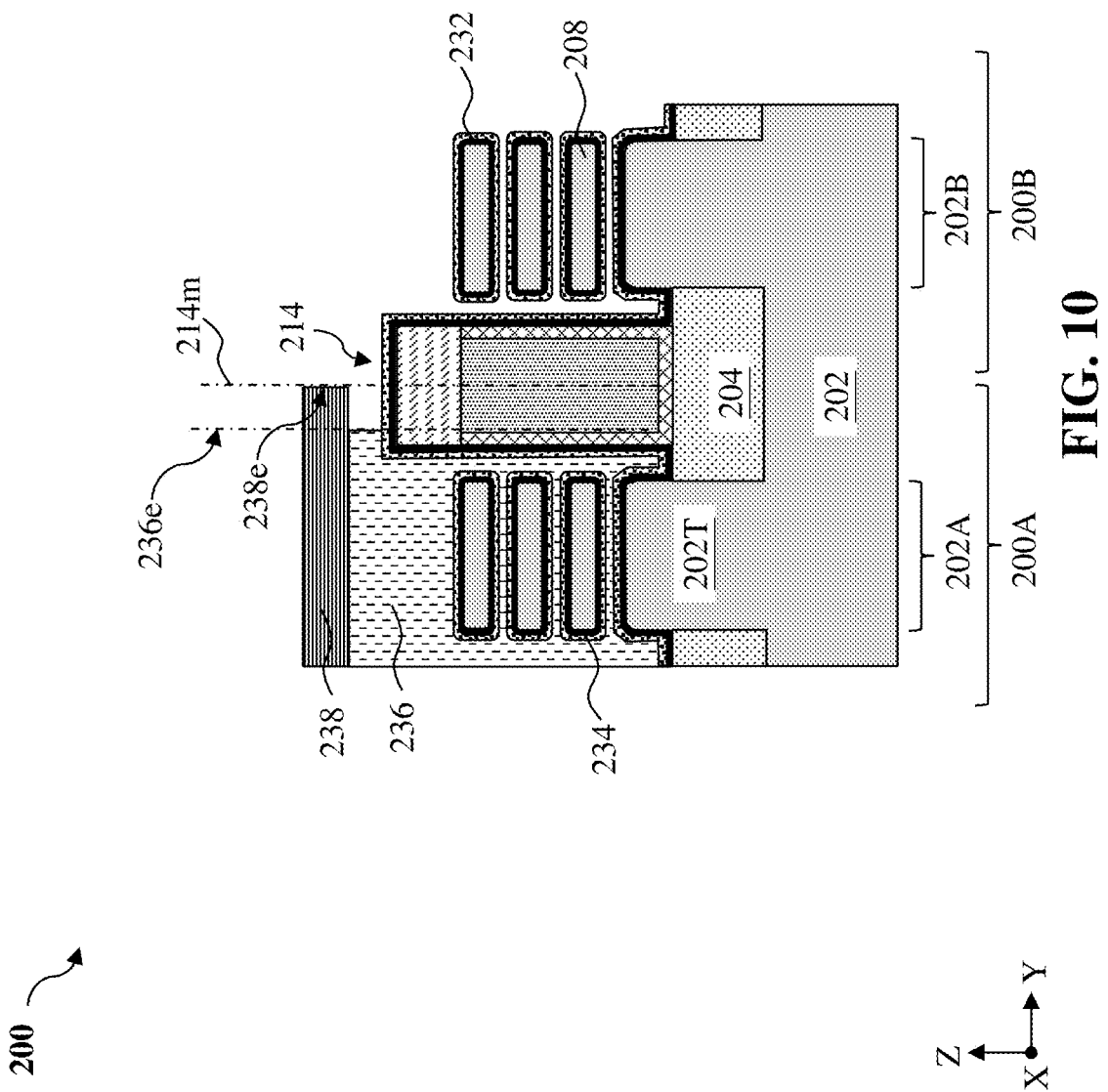

Referring to FIGS. 1, 9 and 10, method 100 includes a block 114 where a patterned mask layer 236 is formed over the workpiece 200 to cover a portion of the p dipole film 234 in the device region 200A. In the present embodiments, the patterned mask layer 236 includes a patterned bottom anti-reflective coating (BARC) layer 236. With reference to FIG. 9, a BARC layer 236 is first formed over the p dipole film 234. The BARC layer 236 may include silicon oxynitride, a polymer, or a suitable material. A combination of the gate dielectric layer 232, the p dipole film 234 and the BARC layer 236 substantially fill the trenches 228 and the openings 230. That is, after the formation of the BARC layer 236, two vertically adjacent channel members 208 are spaced apart by the gate dielectric layer 232, the p dipole film 234, and the BARC layer 236, and the hybrid fin 214 is spaced apart from the vertical stack of channel members 208 by the gate dielectric layer 232, the p dipole film 234, and the BARC layer 236. To pattern the BARC layer 236, a photoresist layer 238 may be blanketly deposited over the workpiece 200, including over the BARC layer 236 in the device region 200A and the device region 200B. The photoresist layer 238 is then exposed to radiation going through or reflected from a mask, baked in a post-bake process, and developed in a developer solution to form a patterned photoresist layer 238, as represented in FIG. 9. In the present embodiments, an edge 238e of the patterned photoresist layer 238 substantially aligns with a center line 214m of the hybrid fin 214.

With reference to FIG. 10, the BARC layer 236 is then patterned using the patterned photoresist layer 238 as an etch mask to form an opening 240. In the present embodiments, since the BARC layer 236 not only fills the trenches 228, but also fills the openings 230, the patterning of the BARC layer 236 may implement an isotropic etching process. That is, an isotropic etching process is performed to remove a portion of the BARC layer 236 in the presence of the patterned photoresist layer 238 serving as an etch mask. In other words, the BARC layer 236 may be etched along the Z direction and along the X direction. Due to undercutting of the isotropic etching process, an edge 236e of the patterned BARC layer 236 would shift or retreat laterally, as represented in FIG. 10. That is, there is an offset between the edge 236e of the patterned BARC layer 236 and the edge 238e of the patterned photoresist layer 238. After forming the patterned BARC layer 236, the patterned photoresist layer 238 may be selectively removed. In embodiments represented in FIG. 11, the patterned BARC layer 236 is formed directly over a portion of the hybrid fin 214, and a rest of the hybrid fin 214 is exposed by the opening 240.

Figure 11:
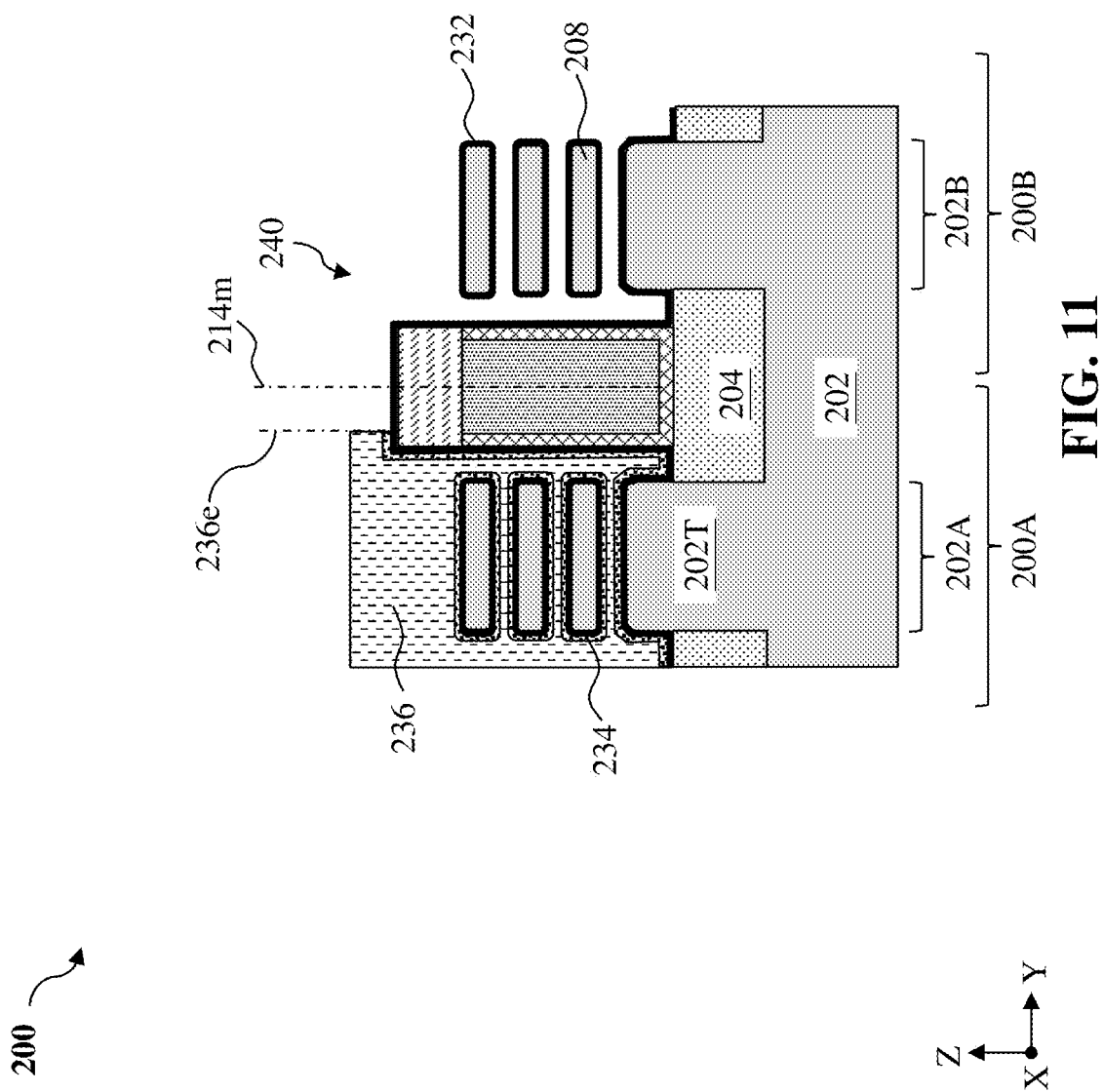
Figure 12:
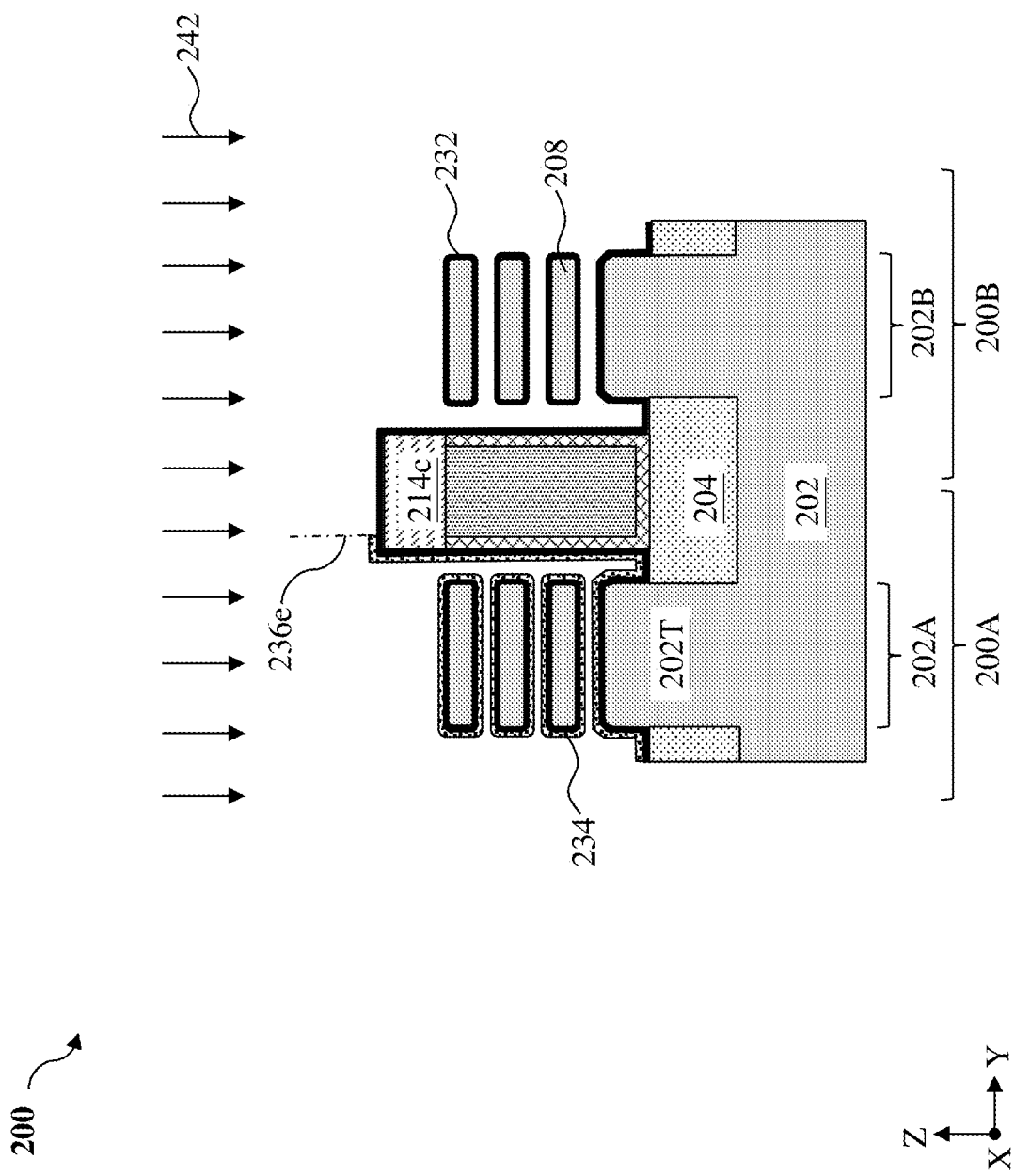

Referring to FIGS. 1, 11, and 12, method 100 includes a block 116 where a portion of the p dipole film 234 not covered by the patterned BARC layer 236 is selectively removed. While using the patterned BARC layer 236 as an etch mask, an etching process is performed to selectively etch away the p dipole film 234 in the device region 200B, as illustrated in FIG. 11. The etching process may be a dry etch process, a wet etch process, or a suitable etch process. After the portion of the p dipole film 234 is selectively removed from the device region 200B, as represented in FIG. 12, the patterned BARC layer 236 may be selectively removed using a suitable etching process.

Referring to FIGS. 1 and 12, method 100 includes a block 118 where the workpiece 200 is annealed by an annealing process 242. At block 118, the annealing process 242 is used to thermally drive elements in the p dipole film 234 into the portion of the gate dielectric layer 232 disposed directly under the p dipole film 234 in the device region 200A. The p dipole film 234 serves as a diffusion doping vehicle to bring its elements to be in direct contact with the gate dielectric layer 232. The annealing process 242 may be a rapid thermal anneal (RTA) process, a laser spike anneal process, a flash anneal process, or a furnace anneal process. In some implementation, the annealing process 242 includes a high anneal temperature between about 700° C. and about 850° C. so as to allow elements, such as gallium, zinc, or aluminum, in the p dipole film 234 to diffuse into the gate dielectric layer 232 in the device region 200A. Because the device region 200B is free of the p dipole film 234, the annealing process 242 at block 118 does not result in any dipole layer material diffusing into the gate dielectric layer 232 in the device region 200B.

After the annealing process 242, the portion of the gate dielectric layer 232 disposed directly under the p dipole film 234 in the device region 200A may include gallium, zinc, or aluminum and may be referred to as a gate dielectric layer 232'. In embodiments where the p dipole film 234 is formed of gallium oxide, gallium in the p dipole film 234 may be diffused into the gate dielectric layer 232 in the device region 200A. Due to lack of any dipole layer, the gate dielectric layer 232 in device region 200B remains substantially unchanged. In embodiments represented in FIG. 12, after the annealing process 242, channel members 208 in the device region 200A is wrapped around by the gate dielectric layer 232', and channel members 208 in the device region 200B is wrapped around by the gate dielectric layer 232. A portion of the top surface of the hybrid fin 214 is covered by the gate dielectric layer 232', and a portion of the top surface of the hybrid fin 214 is covered by the gate dielectric layer 232. An interface 232i between the gate dielectric layer 232' and the gate dielectric layer 232 is disposed directly over the hybrid fin 214 and in the device region 200A. In the present embodiment, the interface 232i aligns with the edge 236e of the patterned BARC layer 236 and is offset from the center line 214m (shown in FIG. 10) of the hybrid fin 214. A sidewall surface of the hybrid fin 214 in the device region 200A is covered by the gate dielectric layer 232' and a sidewall surface of the hybrid fin 214 in the device region 200B is covered by the gate dielectric layer 232.

Figure 13:
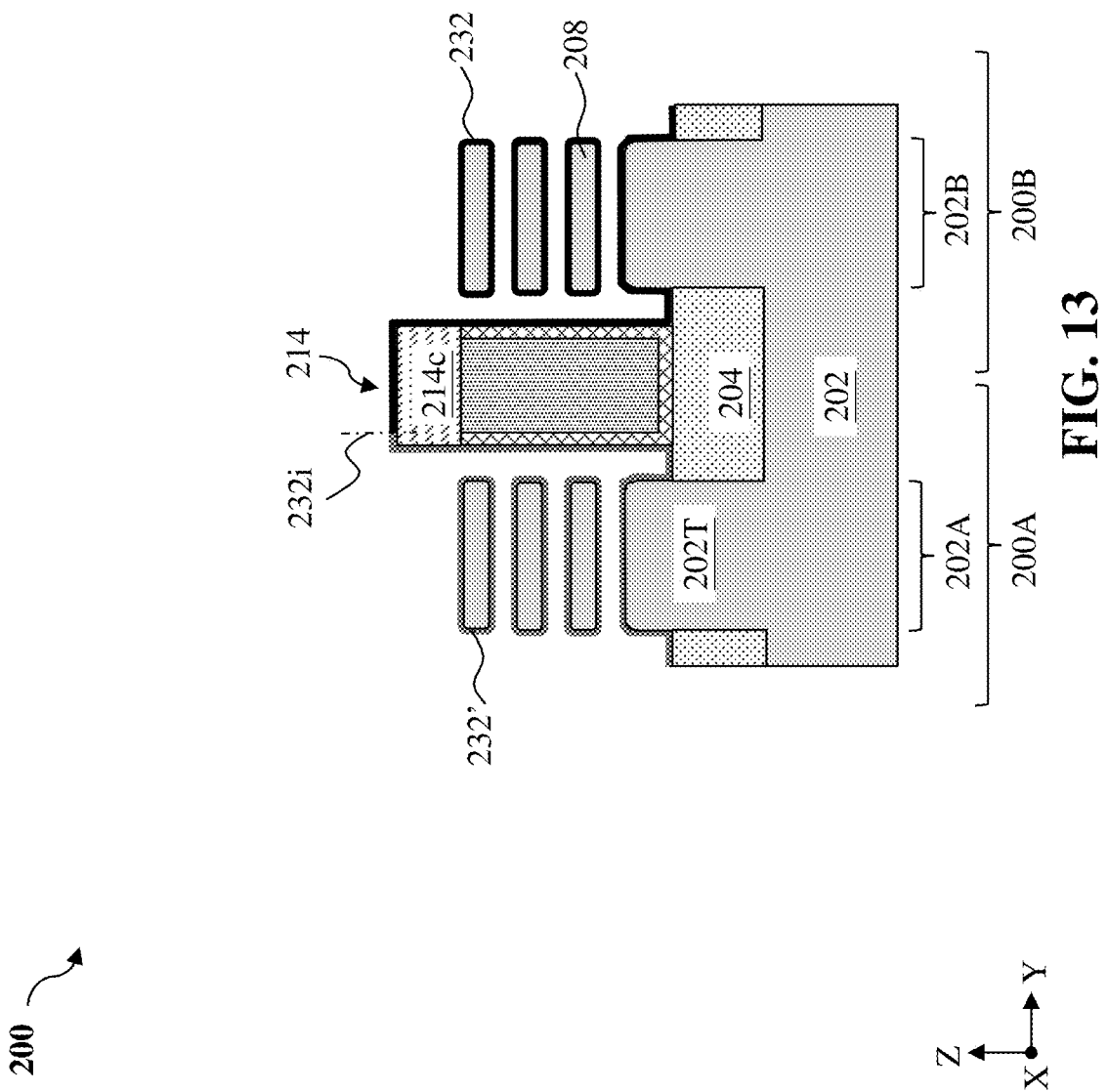

Referring to FIGS. 1 and 13, method 100 includes a block 120 where the portion of the p dipole film 234 in the device region 200A is selectively removed. After the element in the p dipole film 234 is thermally driven into the gate dielectric layer 232 in the device region 200A at block 118, the p dipole film 234 is selectively removed from the device region 200A. The selective removal of the p dipole film 234 releases the room that was employed by the p dipole film 234 and thus enables the deposition of any further layers (e.g., one or more conductive layers 244 shown in FIG. 14) without substantially changing the device's dimension. The operations at block 120 may be performed using a dry etch process, a wet etch process, or a suitable etch process.

Figure 14:
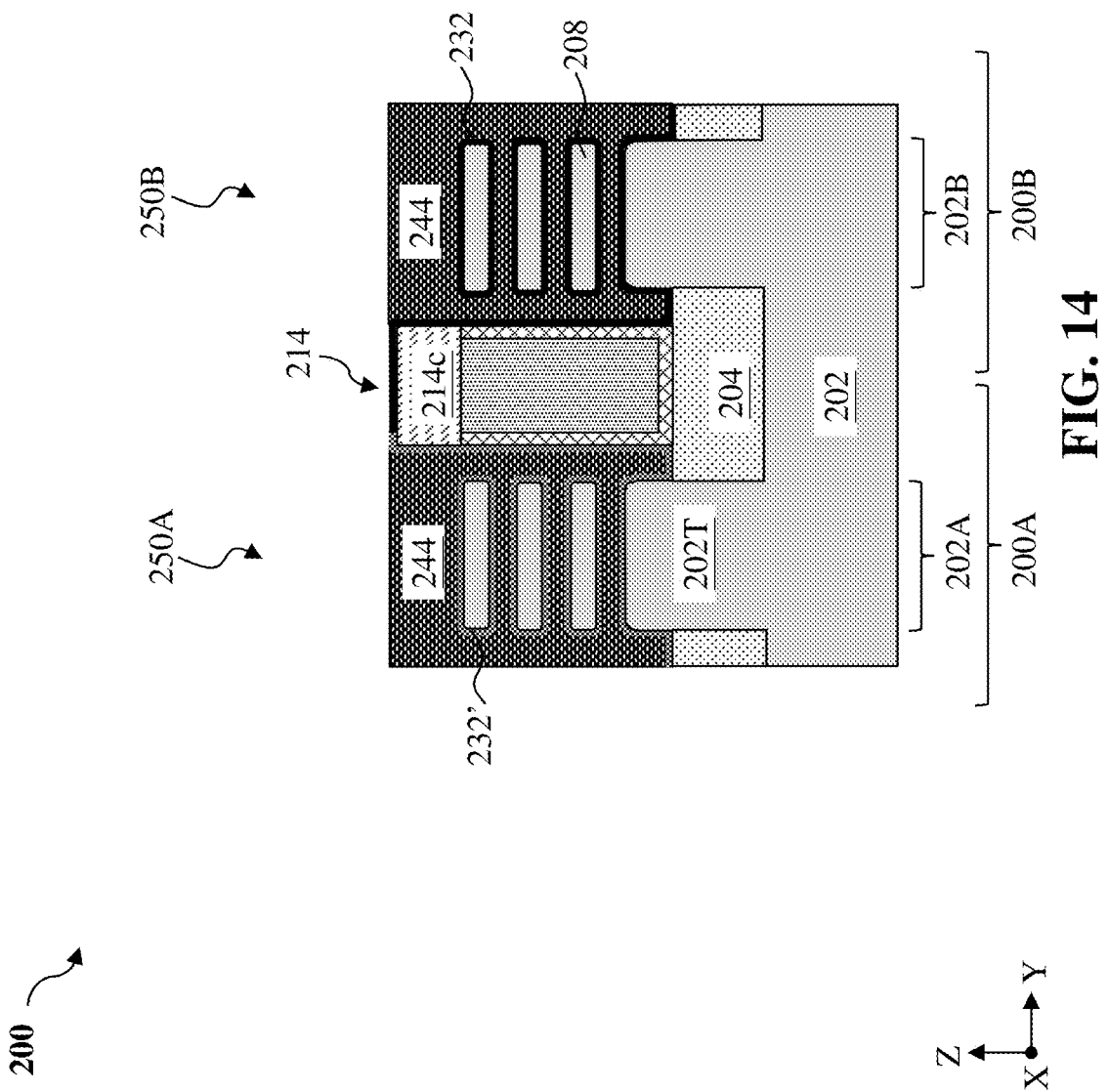
Figure 15:
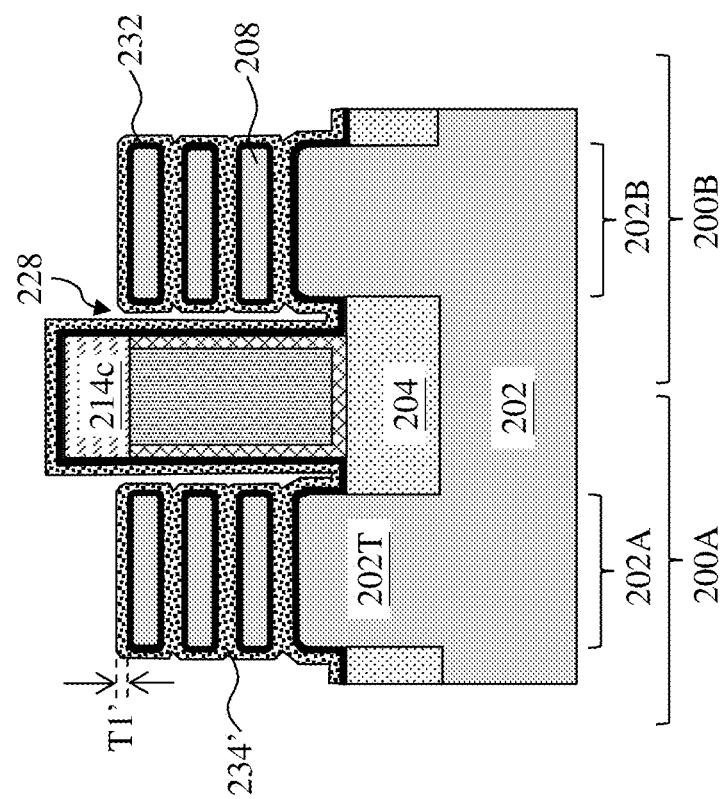

Referring to FIGS. 1 and 14, method 100 includes a block 122 where one or more conductive layers 244 are formed over the workpiece 200 to finish the fabricate of a metal gate stack over the workpiece. Upon conclusion of operations at block 122, a first p-type GAA device 250A and a second p-type GAA device 250B are substantially formed. It is noted that the channel region over the portion 202A of the substrate 202 and the channel region over the portion 202B of the substrate 202 shown in FIG. 14 represent the channel regions of the same device type (i.e., p-type device). The one or more conductive layers 244 shown in FIG. 14 may be a p-type metal gate electrode. The one or more conductive layers 244 may include titanium nitride, titanium silicon nitride, tantalum nitride, tungsten carbonitride, or titanium aluminum nitride, titanium aluminum, titanium aluminum carbide, or tantalum aluminum carbide. In some embodiments of the present disclosure, the one or more conductive layers 244 for devices in the device region 200A and the device region 200B may be formed simultaneously in a similar process flow. By providing the first p-type GAA device 250A and the second p-type GAA device 250B with different gate dielectric layers (i.e., gate dielectric layers 232 and 232'), the first p-type GAA device 250A and the second p-type GAA device 250B would have different threshold voltages.

Referring to FIG. 1, method 100 includes a block 124 where further process are performed. Such further processes may include forming a silicide layer (not depicted) over the source/drain features 220 and a multi-layer interconnect (MLI) structure (not depicted) over the workpiece 200. The MLI may include various interconnect features, such as vias and conductive lines, source/drain contacts, gate contacts, disposed in dielectric layers, such as etch-stop layers and ILD layers (such as ILD layer 224). In some embodiments, the vias are vertical interconnect features configured to interconnect device-level contacts, such as source/drain contacts formed over the source/drain features 220 and gate contacts (not depicted) formed over the gate stack.

In embodiments described with reference to FIGS. 8-14, after the depositing of the p dipole film 234, the openings 230 are still partially filled, and the edge 236e of the patterned BARC layer 236 is offset from the center line 214m of the hybrid fin 214. It is also possible that after the depositing of the p dipole film 234, the openings 230 are substantially filled. For example, in embodiments represented in FIGS. 15-20, the deposition of the p dipole film substantially fills the openings 230, and the edge 236e of the patterned BARC layer 236 aligns with the center line 214m of the hybrid fin 214. More specifically, referring to FIG. 1 and FIG. 15, method 100 includes a block 112 where a p dipole film 234' is conformally deposited over the gate dielectric layer 232. In an embodiment, the p dipole film 234' is conformally deposited over the workpiece 200' to have a generally uniform thickness T1' over the top surface of the workpiece 200'. In some embodiments, the p dipole film 234' may be formed of gallium oxide, zinc oxide, or aluminum oxide and may be deposited using atomic layer deposition (ALD). In one embodiment, the p dipole film 234' may be formed of gallium oxide. In the present embodiments, the combination of the p dipole film 234' and the gate dielectric layer 232 substantially fills the opening 230. That is, the thickness T1' is no less than a half of the height H1 (shown in FIG. 7). In other words, a ratio of the thickness T1' to the height H1 is no less than In the present embodiments, after the depositing of the p dipole film 234', the trench 228 is still partially filled. That is, the width W1 (shown in FIG. 7) is greater than the height H1, and a ratio of the thickness T1' to the width W1 is less than 0.5.

Figure 16:
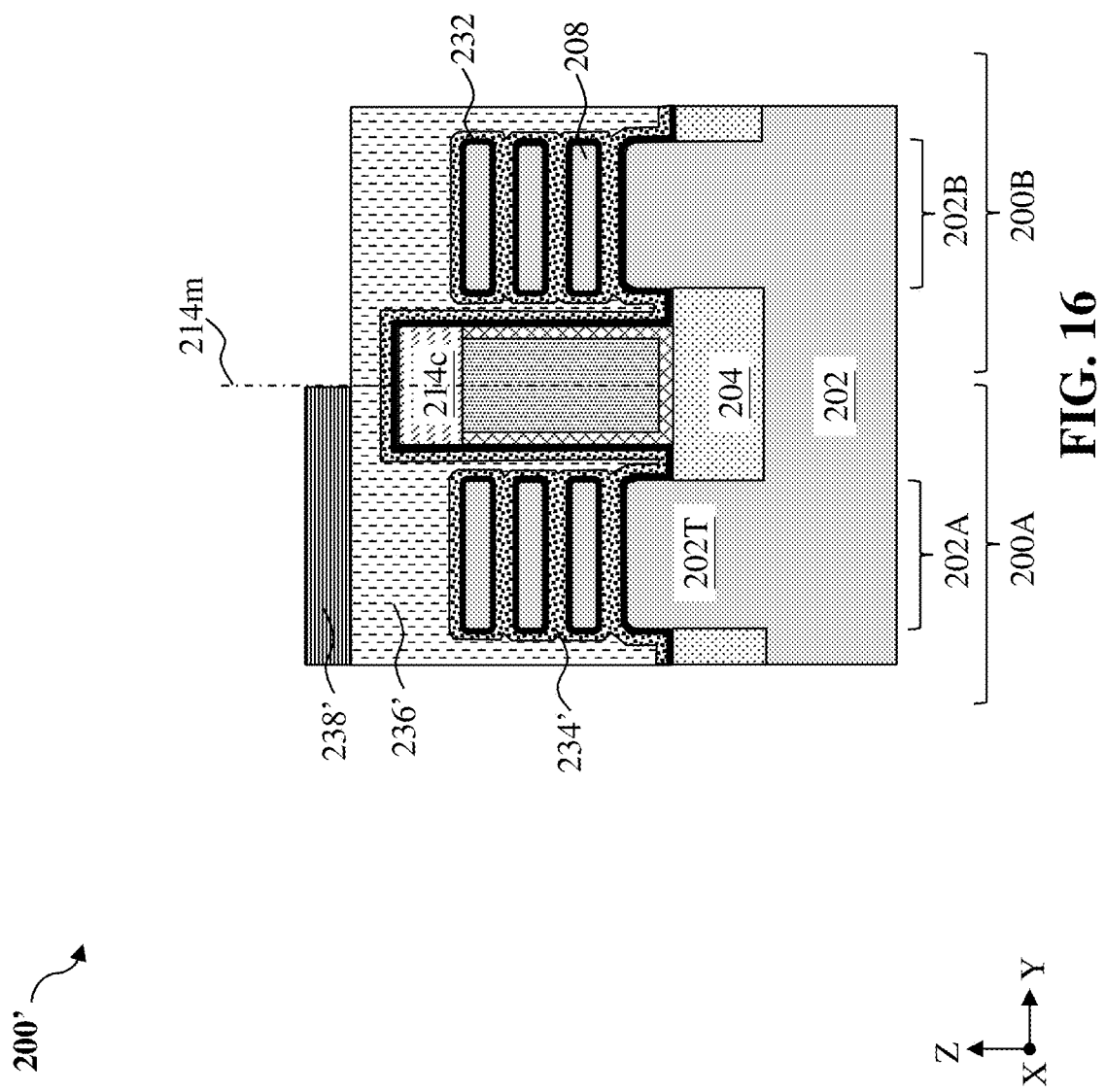
Figure 17:
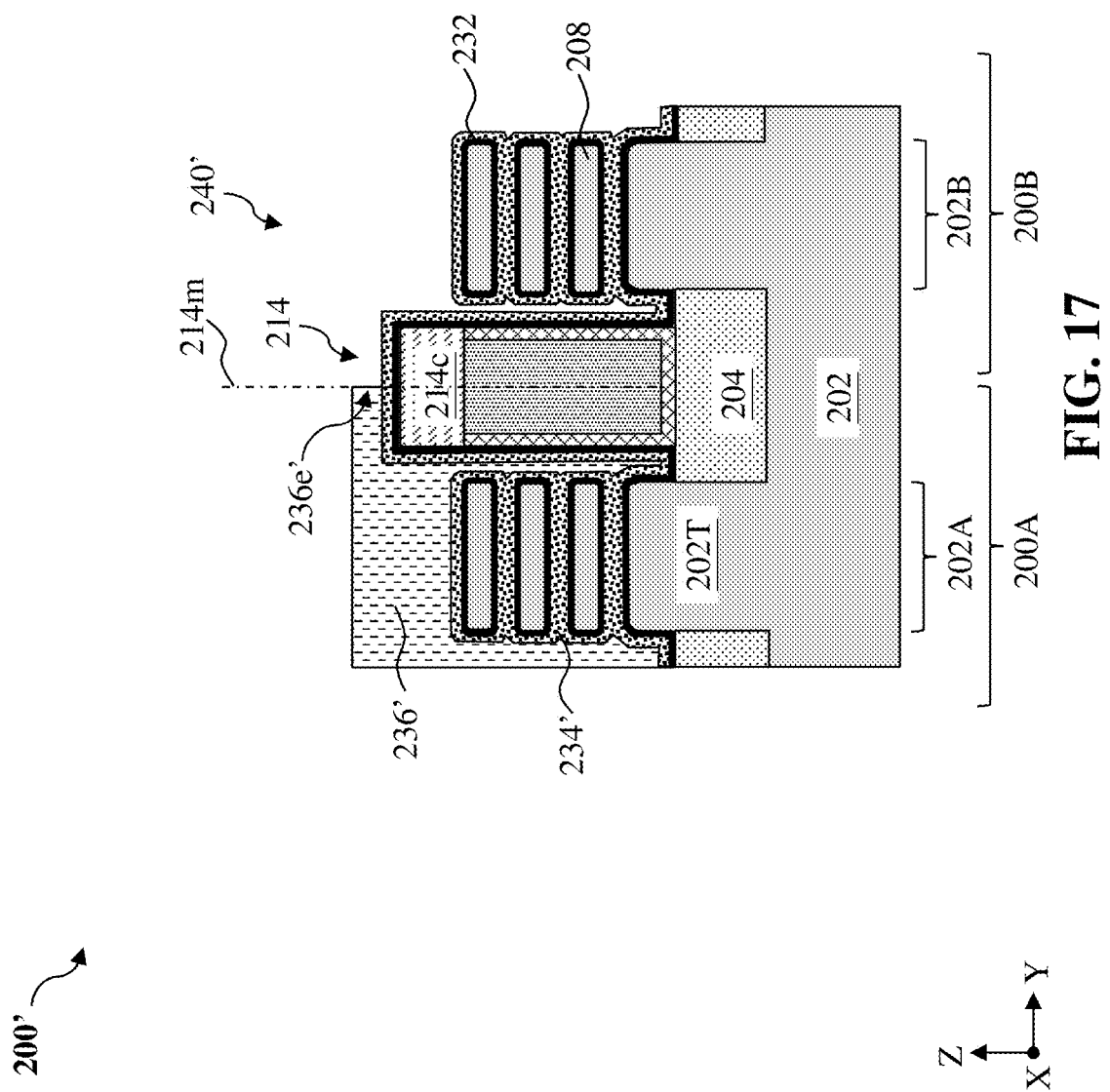
Figure 18:
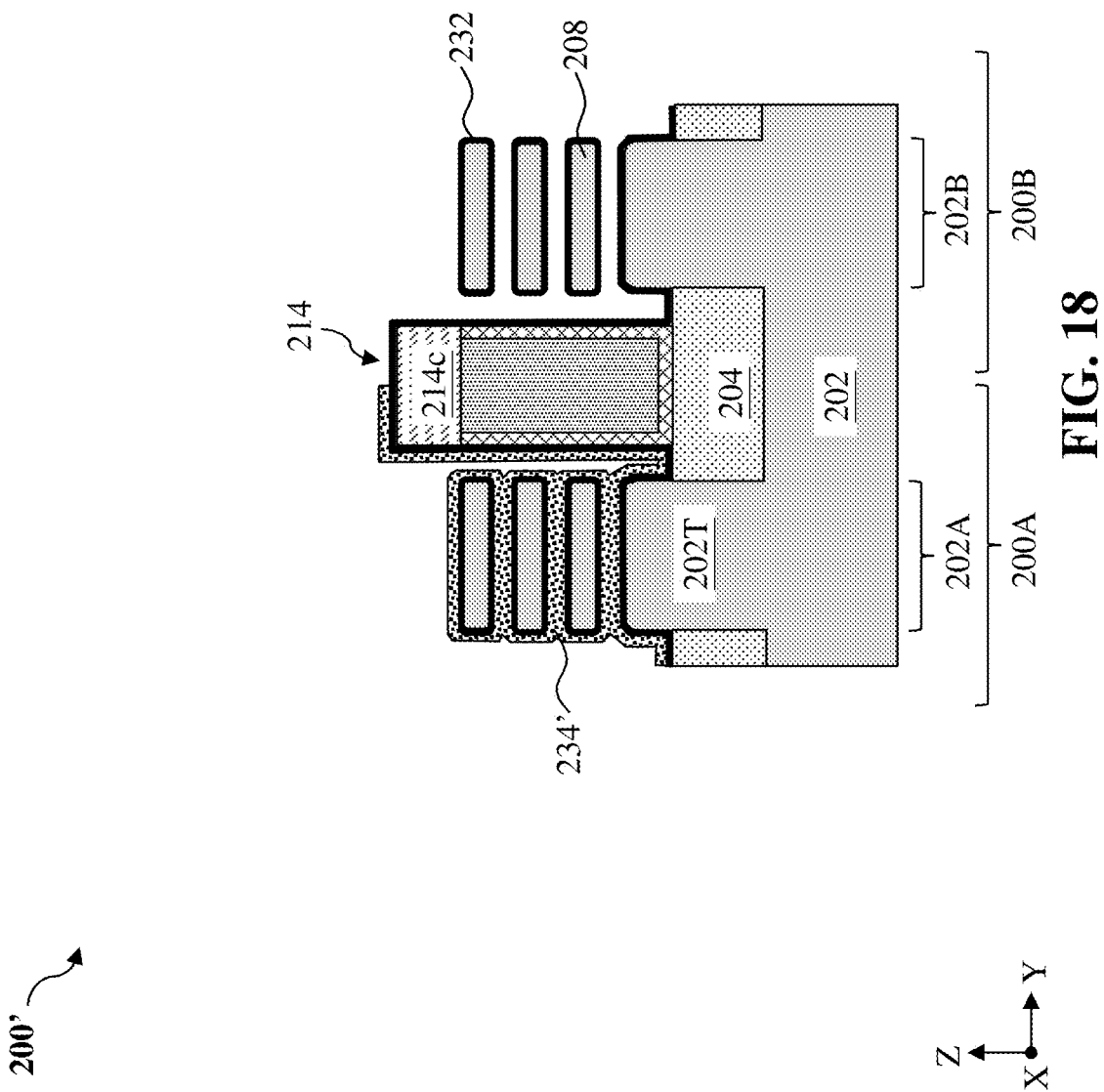
Figure 19:
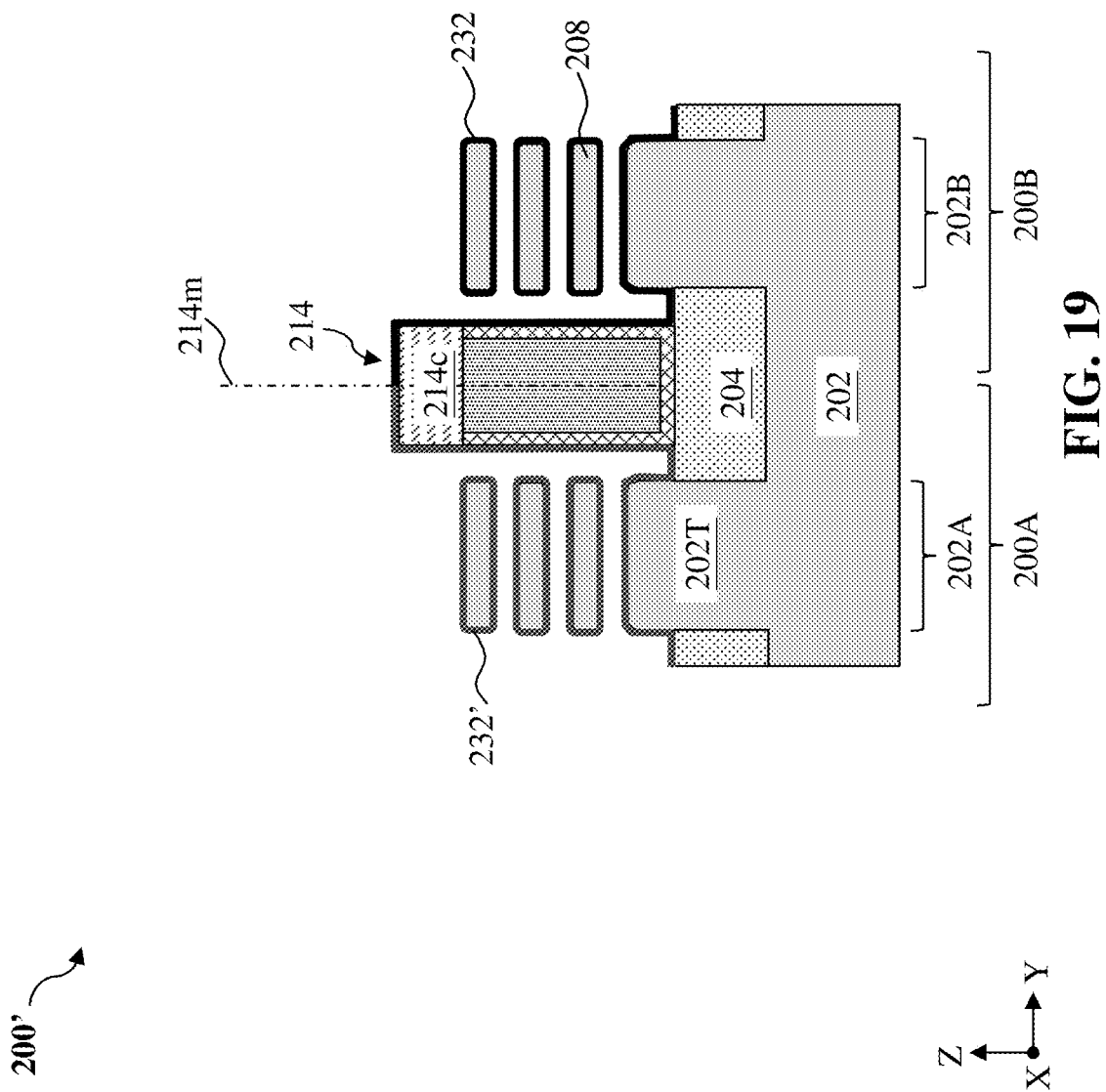

Referring to FIGS. 1, 16, and 17, method 100 includes a block 114 where a patterned mask layer 236' is formed over the workpiece 200' to cover a portion of the p dipole film 234' in the device region 200A. The composition and formation of the patterned mask layer 236' may be in a way similar to those of the patterned mask layer 236. For example, with reference to FIG. 16, a BARC layer 236' is first formed over the p dipole film 234'. A photoresist layer 238' may be blanketly deposited over the workpiece 200', including over the BARC layer 236' in the device region 200A and the device region 200B. The photoresist layer 238' is then exposed to radiation going through or reflected from a mask, baked in a post-bake process, and developed in a developer solution to form a patterned photoresist layer 238', as represented in FIG. 16. In the present embodiments, the edge 238e of the patterned photoresist layer 238' aligns with the center line 214m of the hybrid fin 214.

With reference to FIG. 17, the BARC layer 236' is then patterned using the patterned photoresist layer 238' as an etch mask to form an opening 240'. In the present embodiment, since the gate dielectric layer 232 and the p dipole film 234' substantially fill the openings 230, the BARC layer 236' would not be formed between two vertically adjacent channel members or between the bottommost channel member 208 and the top portion 202T of the substrate 202. Therefore, the patterning of the BARC layer 236' may implement an anisotropic etching process. That is, an anisotropic etching process is performed to remove a portion of the BARC layer 236' in the device region 200B using the patterned photoresist layer 238' as an etch mask. In other words, the BARC layer 236' may be substantially etched along the Z direction and no undercutting will be resulted. As a result of the anisotropic etching process, an edge 236e' of the patterned BARC layer 236' aligns with the center line 214m of the hybrid fin 214. After forming the patterned BARC layer 236', the patterned photoresist layer 238' may be selectively removed. Operations in blocks 116-124 of method 100 in FIG. 1 may be then performed to finish the fabrication of the p-type GAA transistors 250A and 250B. The workpiece 200' shown in FIG. 20 is in a way similar to the workpiece 200 shown in FIG. 14 except that the interface between the gate dielectric layer 232 and 232' of aligns with the center line 214m of the hybrid fin 214 in the workpiece 200'.

In the embodiments described above, the workpiece 200/200' includes a first p-type GAA device 250A formed in the device region 200A having a first threshold voltage that is different from a threshold voltage of a second p-type GAA device 250B formed in the device region 200B. In some other implementations, the workpiece may include three device regions and the corresponding p-type GAA devices formed in the respective device region have a threshold voltage that is different from the threshold voltages of the rest of the p-type GAA devices formed in other device regions. FIG. 21 illustrates a flowchart of a method 300 for forming a first p-type GAA device in a device region 200A of the workpiece 200, a second p-type GAA device in a device region 200B of the workpiece 200, and a third p-type GAA device in a device region 200C of the workpiece 200. The first, second, and third p-type GAA devices each has a threshold voltage that is different from the threshold voltages of the other two p-type GAA devices. Method 300 is described in conjunction with FIGS. 2-3 and FIGS. 22-33, which are fragmentary cross-sectional views or top views of a workpiece 200 at different stages of fabrication according to embodiments of method 300. FIGS. 22-33 are cross-sectional views of the workpiece 200 taken along line C-C' shown in FIG. 2. For reason of clarification, the workpiece 200 taken along line C-C' is referred to as a workpiece 400. In the present embodiments, the workpiece 400 includes the fin-shaped active region 205a formed in the device region 200A, the fin-shaped active region 205b formed in the device region 200B, and the fin-shaped active region 205c formed in the device region 200C. After performing the operations in block 110 of method 100, method 300 is employed to perform operations to the workpiece 400.

Figure 22:
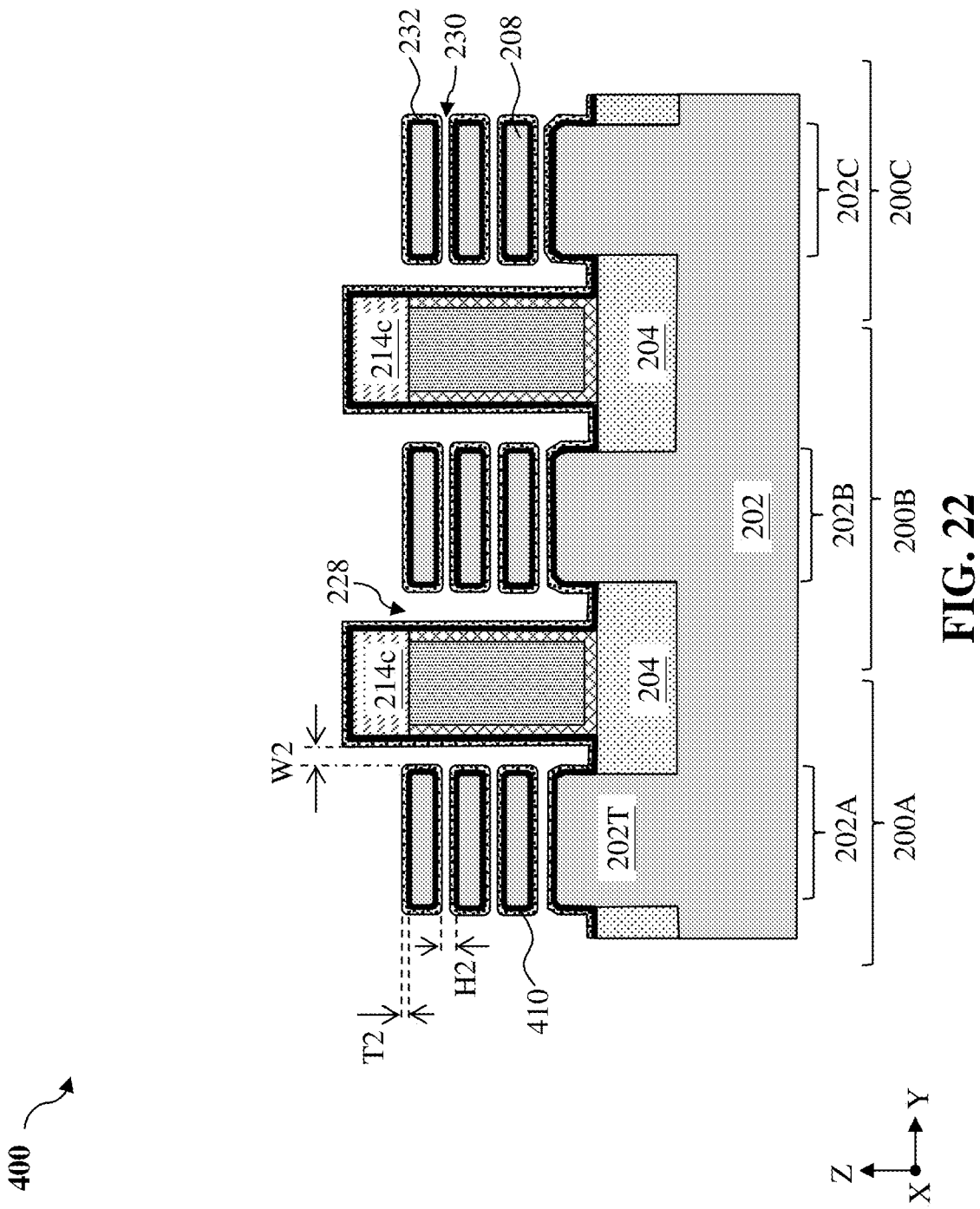
FIGS. 22, 23, 24, 25, 26, 27, 28, 29, 30, 31, 32, and 33 illustrate fragmentary cross-sectional views of the workpiece taken along line C-C' as shown in FIG. 2 during various fabrication stages in the method of FIG. 21, according to various aspects of the disclosure.

Referring to FIGS. 21 and 22, method 300 includes a block 302 where a first p dipole film 410 is deposited over the gate dielectric layer 232. In an embodiment, the first p dipole film 410 is conformally deposited over the workpiece 400 to have a generally uniform thickness T2 over the top surface of the workpiece 400. In some embodiments, the first p dipole film 410 may be formed of gallium oxide, zinc oxide, or aluminum oxide and may be deposited using atomic layer deposition (ALD). In one embodiment, the first p dipole film 410 is formed of gallium oxide. In the present embodiments, after the depositing of the first p dipole film 410, the trenches 228 and openings 230 are still partially filled. That is, the thickness T2 is less than a half of the height H1 (shown in FIG. 7) and is less than a half of the width W1 (shown in FIG. 7). In other words, a ratio of the thickness T2 to the height H1 is less than 0.5. After the depositing of the first p dipole film 410, each of the openings 230 has a height H2 along the Z direction, and each of the trenches 228 has a width W2 along the Y direction.

Figure 23:
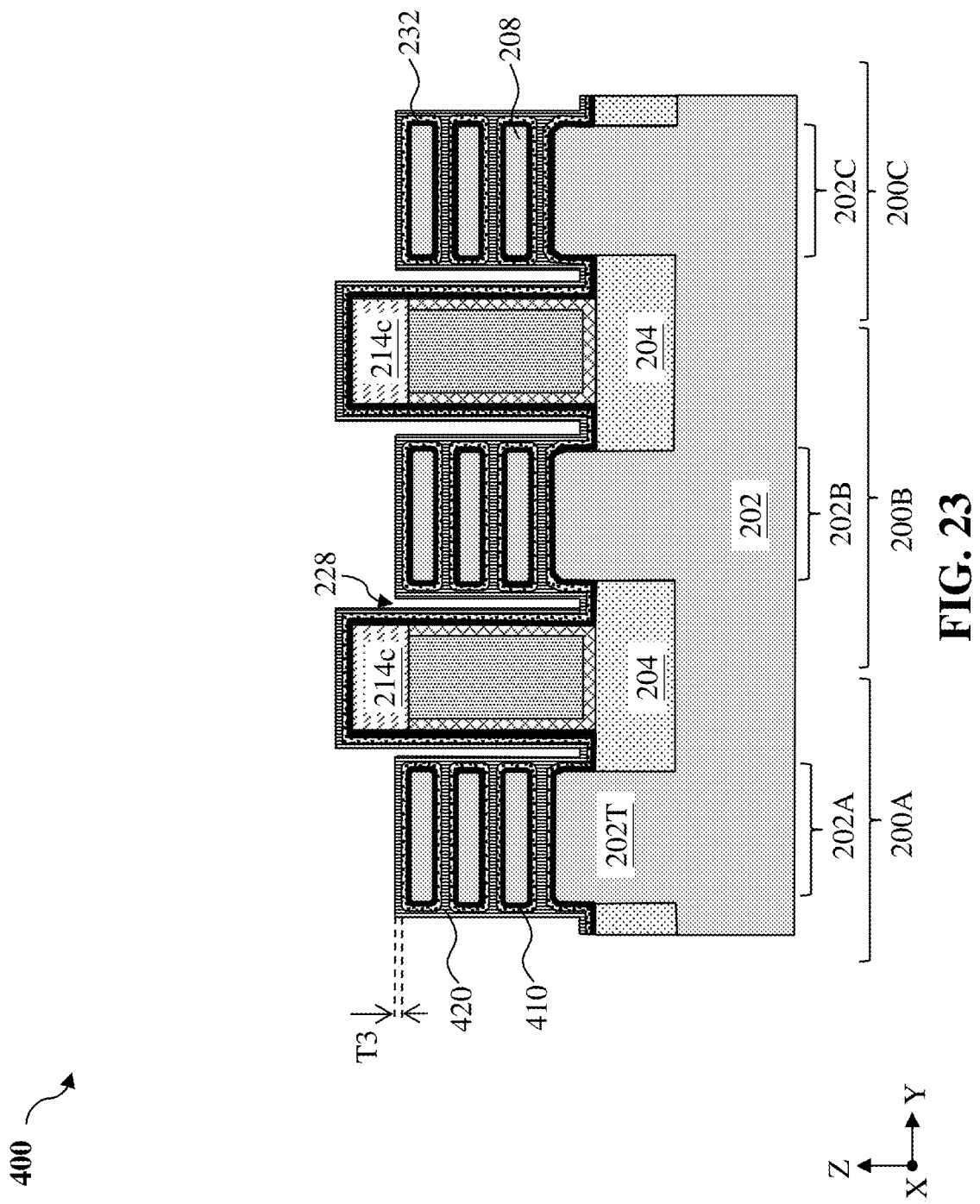

Referring to FIGS. 21 and 23, method 300 includes a block 304 where a first hard mask layer 420 is conformally formed over the first p dipole film 410. The first hard mask layer 420 is conformally deposited over the first p dipole film 410 to have a generally uniform thickness T3 over the top surface of the workpiece 400. In some embodiments, the first hard mask layer 420 may be formed of titanium nitride (TiN) and may be deposited using atomic layer deposition (ALD). In one embodiment, the first hard mask layer 420 is formed of titanium nitride. In the present embodiments, after the depositing of the first hard mask layer 420, the openings 230 are substantially filled and the trenches 228 are still partially filled. That is, a ratio of the thickness T3 to the height H2 is no less than 0.5, and a ratio of the thickness to the width W2 is less than 0.5.

Figure 24:
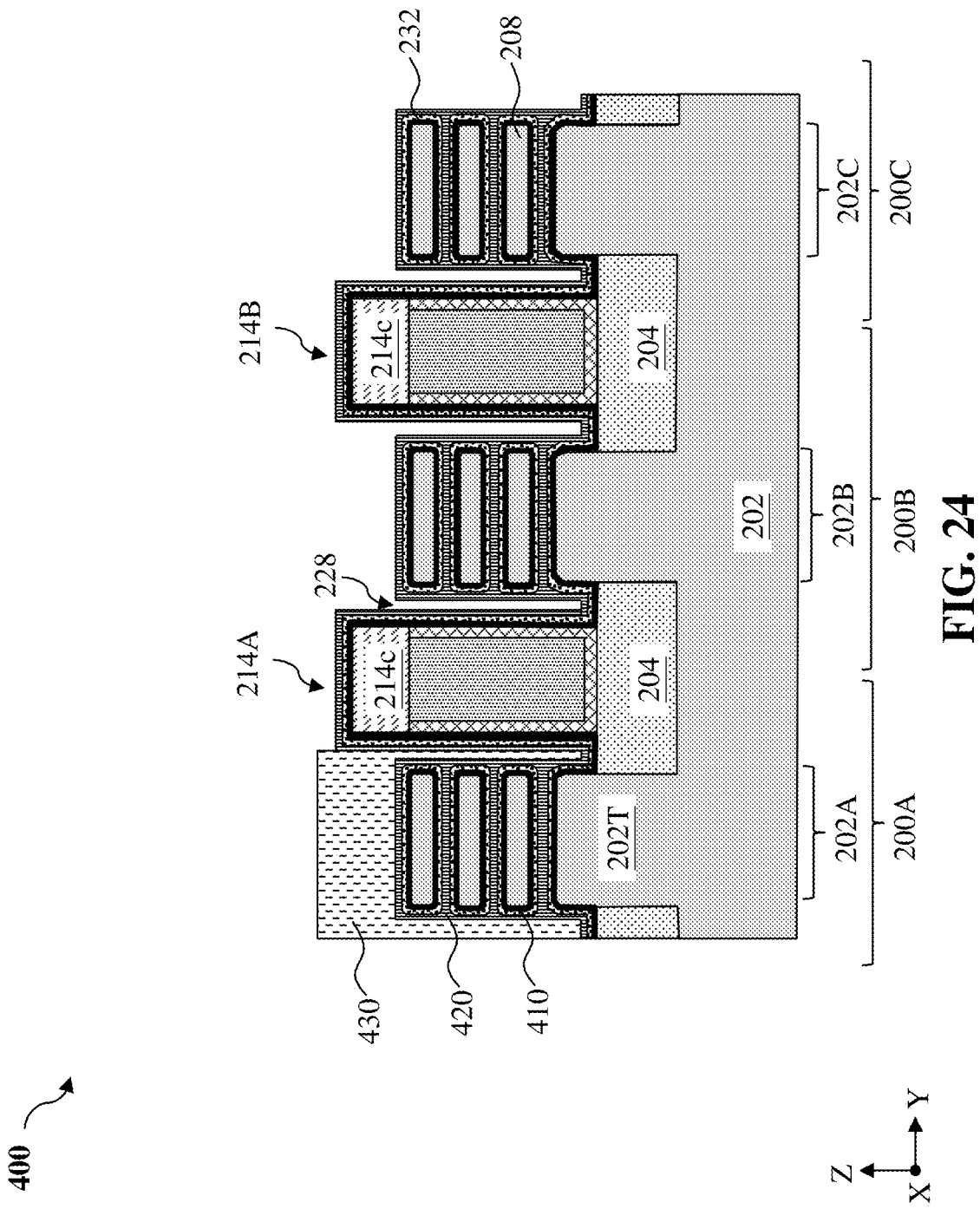
Figure 25:
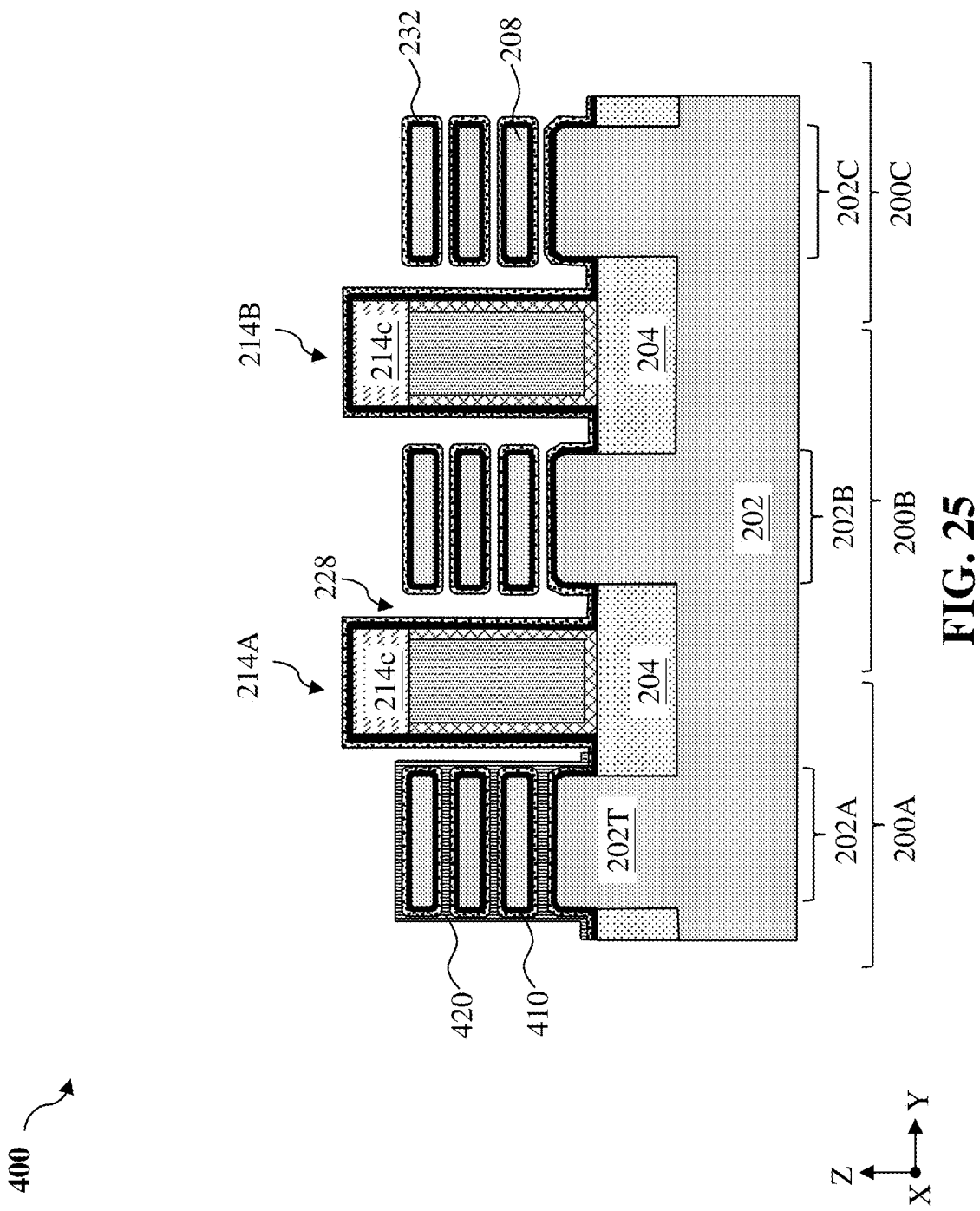

Referring to FIGS. 21, 24 and 25, method 300 includes a block 306 where the first hard mask layer 420 is patterned to cover only a portion of the first p dipole film 410 in the device region 200A. For ease of identification, the hybrid fin 214 disposed between the portion 202A of the substrate 202 and the portion 202B of the substrate 202 is referred to as the hybrid fin 214A, and the hybrid fin 214 disposed between the portion 202B of the substrate 202 and the portion 202C of the substrate 202 is referred to as the hybrid fin 214B. As represented in FIG. 24, a patterned bottom antireflective coating (BARC) layer 430 is formed directly over the channel layers 208 in the device region 200A. In the present embodiments, the patterned BARC layer 430 is formed over the channel layers 208 in the device region 200A without being formed over the hybrid fin 214A. In an embodiment, the hybrid fin 214A is spaced apart from the channel layers 208 over the portion 202A by the gate dielectric layer 232, the first p dipole film 410, the first hard mask layer 420, and the patterned BARC layer 430. That is, the trenches 228 in the device region 200A are substantially filled by the gate dielectric layer 232, the first hard mask layer 420, the first p dipole film 410, and the patterned BARC layer 430. In an embodiment, the patterned BARC layer 430 is in direct contact with the sidewall surface of the hybrid fin 214A without being formed over the hybrid fin 214A. The formation of the patterned BARC layer 430 may be in a way similar to that of the patterned BARC layer 236 described with reference to FIG. 10, and repeated description is omitted for reason of simplicity. Since the openings 230 are already substantially filled before the deposition of the BARC layer 430, no BARC layer 430 would be formed in the openings 230. Therefore, the patterning of the BARC layer 430 may implement an anisotropic etching process that is similar to the patterning of the BARC layer 236' described with reference to FIGS. 16-17. Referring to FIG. 25, while using the patterned BARC layer 430 as an etch mask, an etching process is then performed to remove a portion of the first hard mask layer 420 that is not covered by the patterned BARC layer 430 to form a patterned first hard mask layer 420 over the device region 200A. The patterning of the first hard mask layer 420 exposes portions of the first p dipole film 410 in the device region 200B and in the device region 200C. The patterned BARC layer 430 may be selectively removed after forming the patterned first hard mask layer 420 over the device region 200A.

Figure 26:
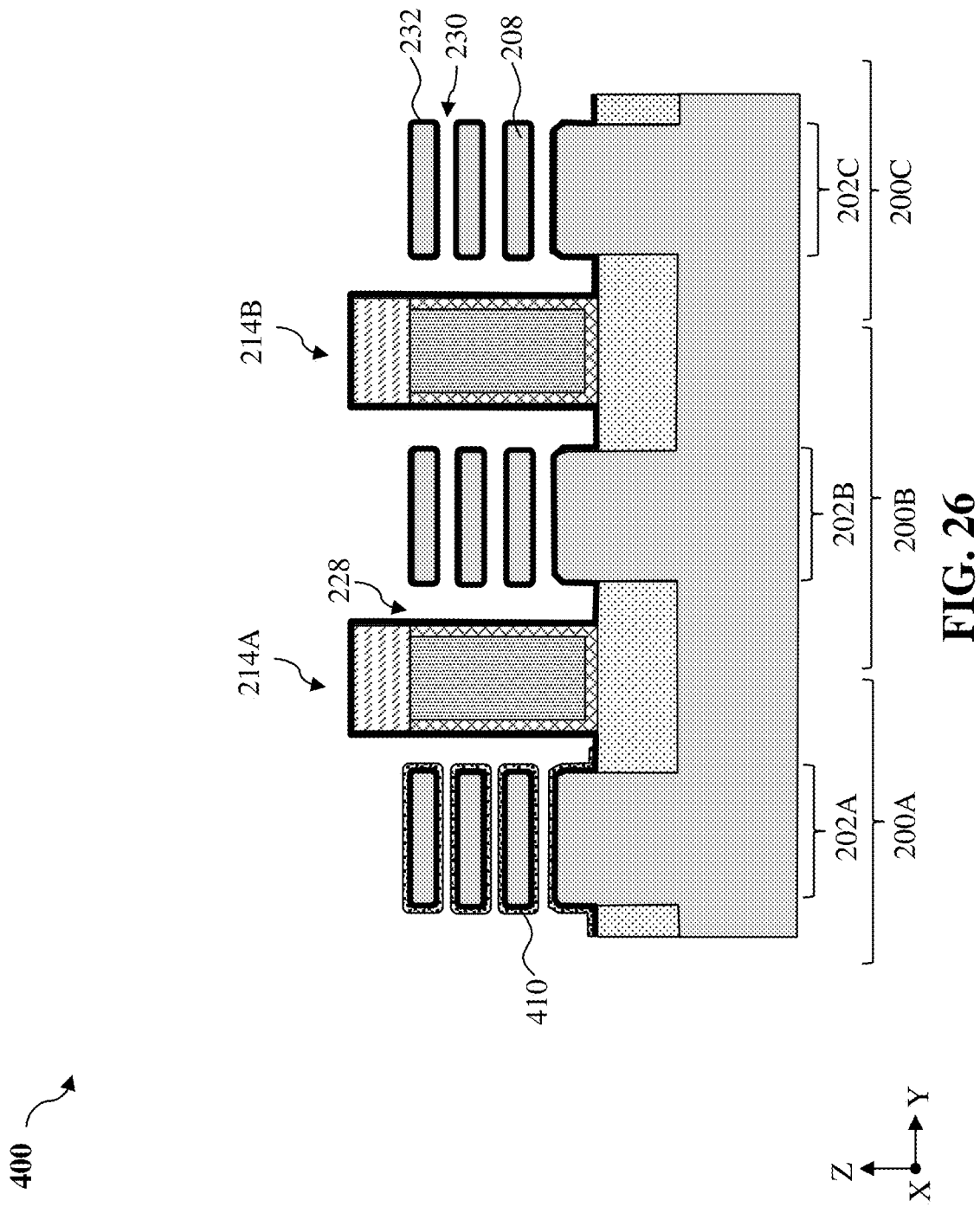

Referring to FIGS. 21 and 26, method 300 includes a block 308 where portions of the first p dipole film 410 not covered by the patterned first hard mask layer 420 are selectively removed from the device region 200B and the device region 200C. While using the patterned first hard mask layer 420 as an etch mask, an etching process is performed to selectively etch away the first p dipole film 410 in the device regions 200B and 200C, as illustrated in FIG. 26. The etching process may be a dry etch process, a wet etch process, or a suitable etch process. After the portion of the first p dipole film 410 is selectively removed from device regions 200B and 200C, the patterned first hard mask layer 420 in the device region 200A may be selectively removed using a suitable etching process without substantially etching the first p dipole film 410. In an embodiment, the etching process may be a wet etching process that implements a combination of hydrogen peroxide ($H_2O_2$) and hydrochloric acid (HCl). Other suitable etchants are also possible.

Figure 27:
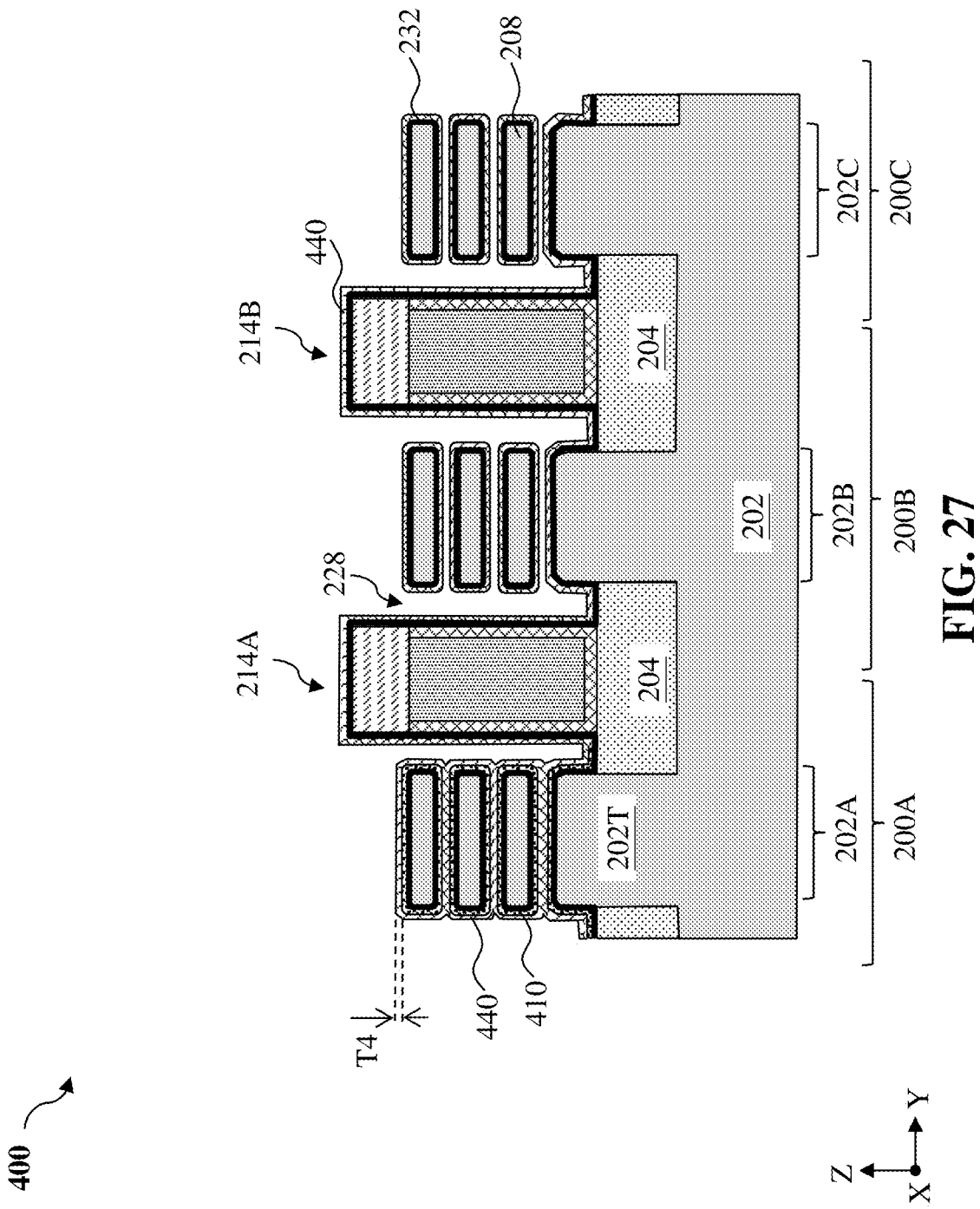

Referring to FIGS. 21 and 27, method 300 includes a block 310 where a second p dipole film 440 is conformally formed over the workpiece 400. In an embodiment, the second p dipole film 440 is conformally deposited over the workpiece 400 to have a generally uniform thickness T4 over the top surface of the workpiece 400. In some embodiments, the second p dipole film 440 may be formed of gallium oxide, zinc oxide, or aluminum oxide and may be deposited using atomic layer deposition (ALD). The composition of the second p dipole film 440 may be the same as or different from the composition of the first p dipole film 410. In one embodiment, the first p dipole film 410 is formed of gallium oxide, and the second p dipole film 440 is formed of aluminum oxide. In the present embodiments, after the depositing of the second p dipole film 440, the openings 230 in the device region 200A are substantially filled, while the openings 230 in the device regions 200B and 200C and the trenches 228 in the workpiece 400 are partially filled. In some other implementations, after the depositing of the second p dipole film 440, the openings 230 in the device region 200A may also be partially filled. It is noted, in either embodiments, after the depositing of the second p dipole film 440, the trenches 228 in the device regions 200A, 200B, and 200C are still partially filled.

Figure 28:
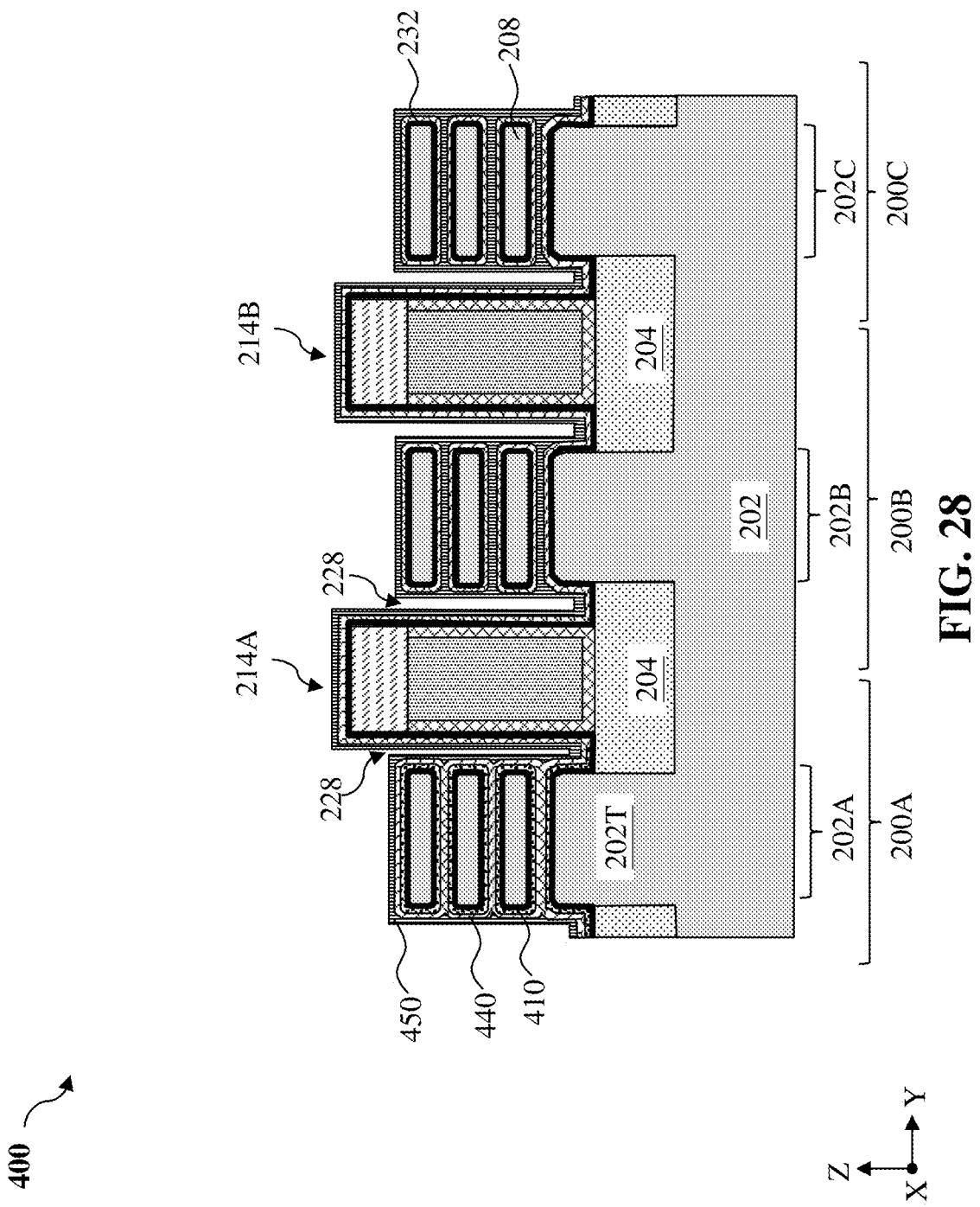
Figure 29:
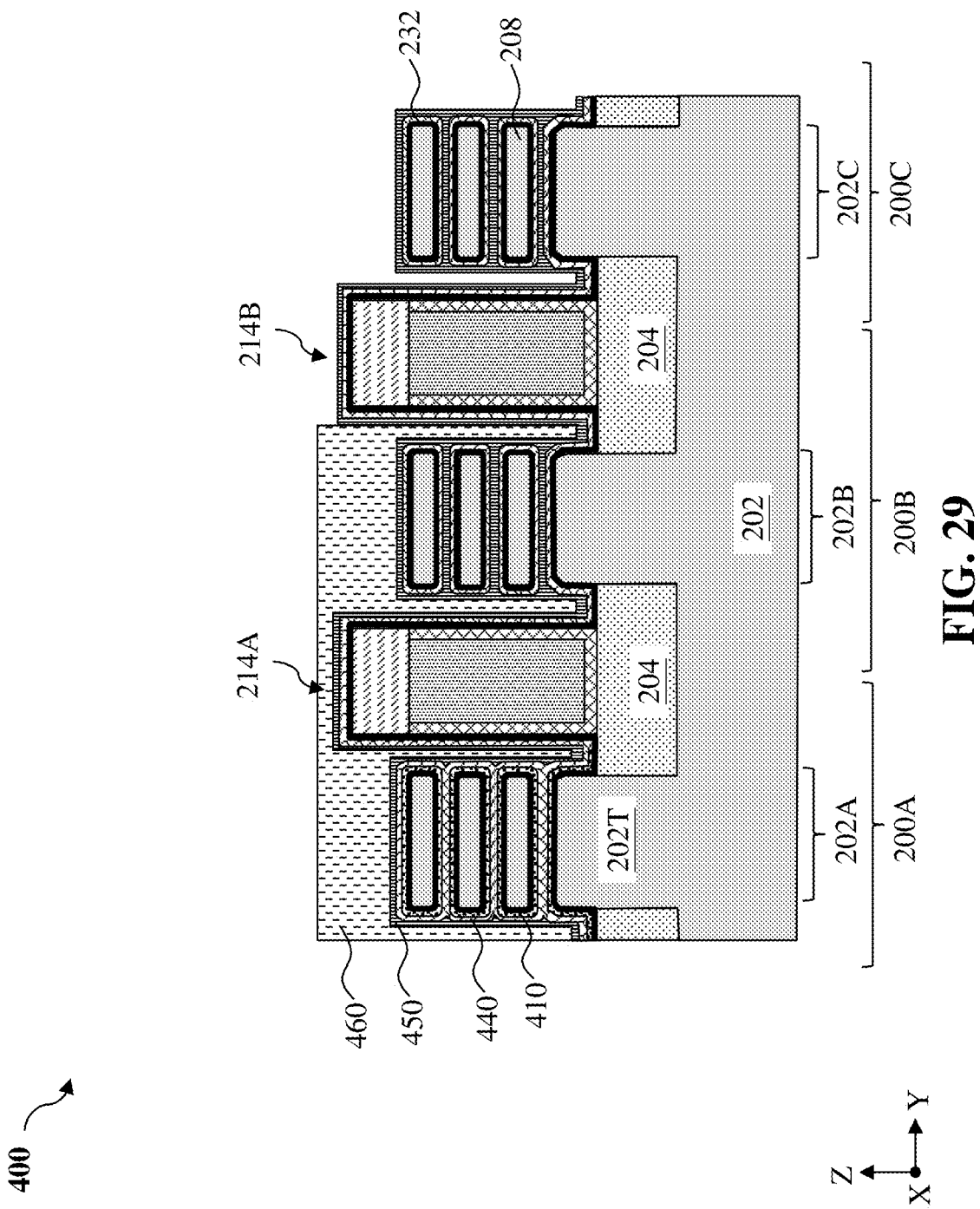

Referring to FIGS. 21, 28, 29, 30, and 31, method 300 includes a block 312 where a portion of the second p dipole film 440 formed in the device region 200C is selectively removed. With reference to FIG. 28, after forming the second p dipole film 440, a second hard mask layer 450 is conformally formed over the second p dipole film 440. The formation and composition of the second hard mask layer 450 may be in a way similar to the formation and composition of the first hard mask layer 420, and repeated descriptions are omitted for reason of simplicity. In the present embodiments, after the depositing of the second hard mask layer 450, the openings 230 are substantially filled and the trenches 228 are partially filled. Subsequently, as shown in FIG. 29, a patterned bottom antireflective coating (BARC) layer 460 is formed directly over the channel layers 208 in the device regions 200A and 200B and over the hybrid fin 214A. The formation of the patterned BARC layer 460 may be in a way similar to the formation of the BARC layer 236, and repeated descriptions are omitted for reason of simplicity.

Figure 30:
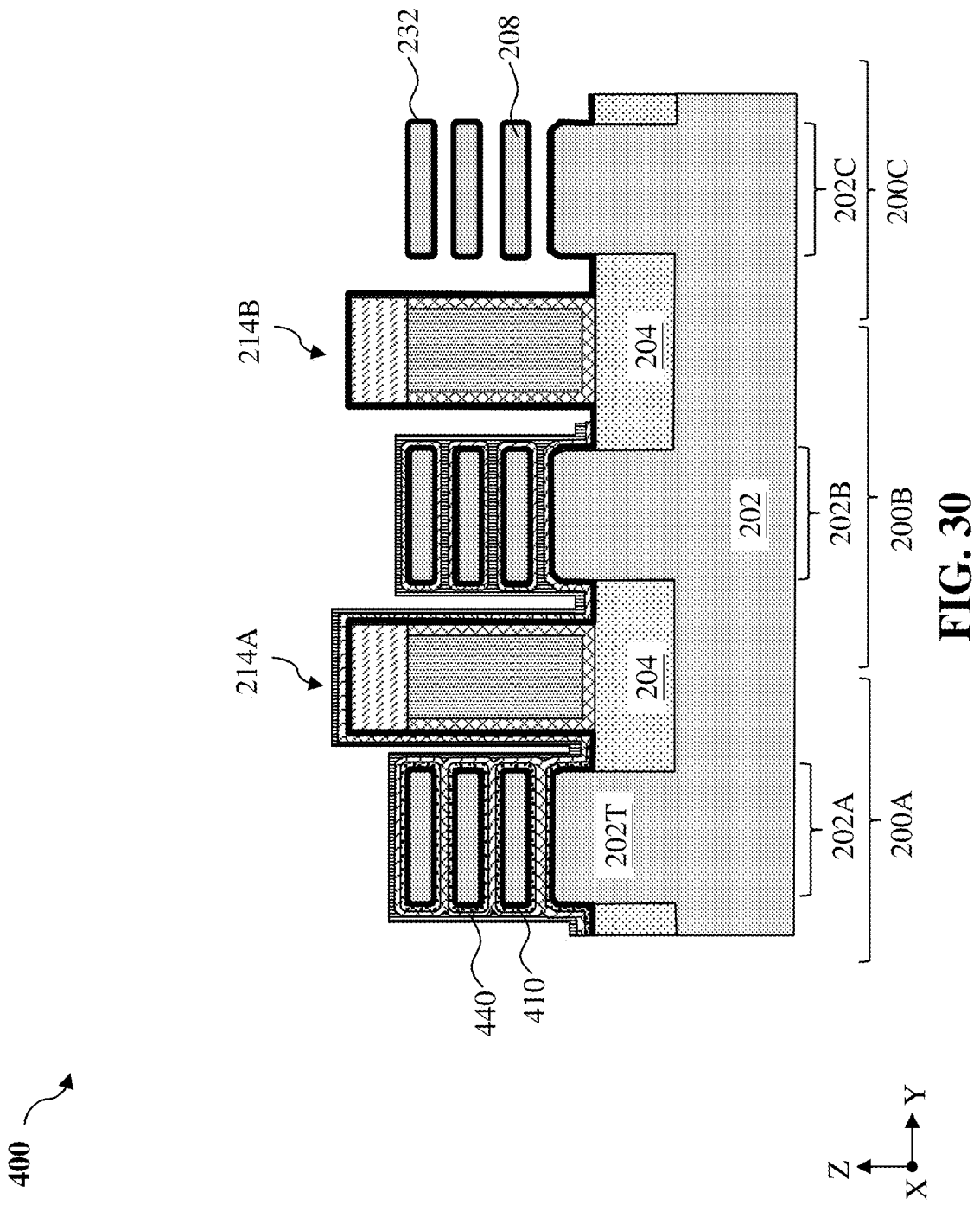

With reference to FIG. 30, after forming the patterned BARC layer 460, an etching process may be subsequently performed to pattern the second hard mask layer 450 while using the patterned BARC layer 460 as an etch mask. During the patterning, the portion of the second hard mask layer 450 that is not covered by the patterned BARC layer 460 may be selectively removed. Subsequently, the portion of the second p dipole film 440 that is exposed by the patterned second hard mask layer 450 is selectively removed, as represented in FIG. 30. The patterned second hard mask layer 450 may be then selectively removed after the selective removal of the portion of the second p dipole film 440 in the device region 200C. The etching process used to selectively remove the second hard mask layer 450 may be in a way similar to the etching process used to selectively remove the portions of the first hard mask layer 420, described with reference to FIGS. 25-26. That is, after performing the operations in block 312, the workpiece 400 includes the first p dipole film 410 and the second p dipole film 440 in the device region 200A, the second p dipole film 440 in the device region 200B, and the device region 200C is free of the first and second p dipole films 410 and 440. Sidewall and top surfaces of the hybrid fin 214A is covered by the second p dipole film 440, and sidewall and top surfaces of the hybrid fin 214B is free of the first and second p dipole films 410 and 440.

Figure 31:
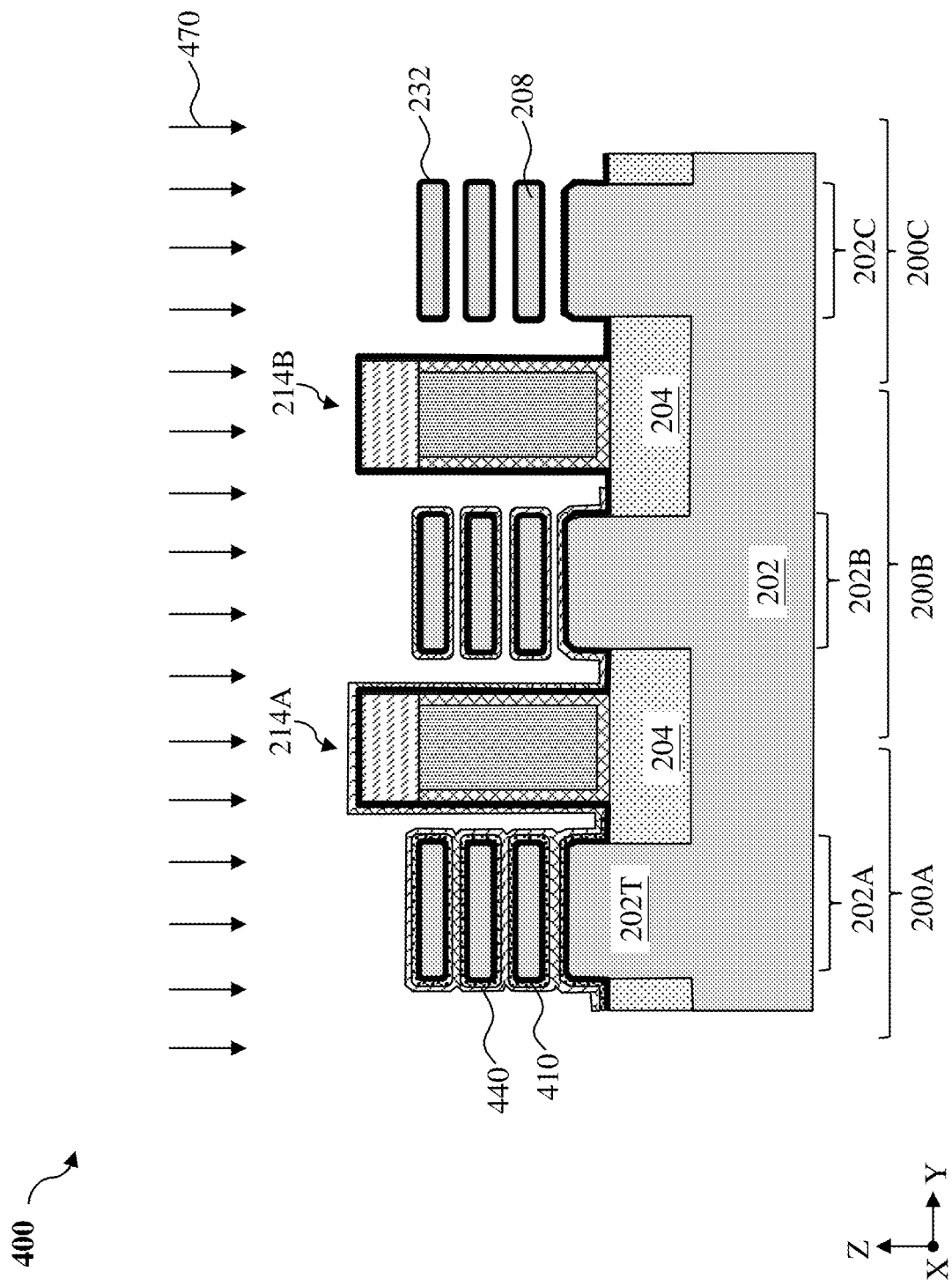
Figure 32:
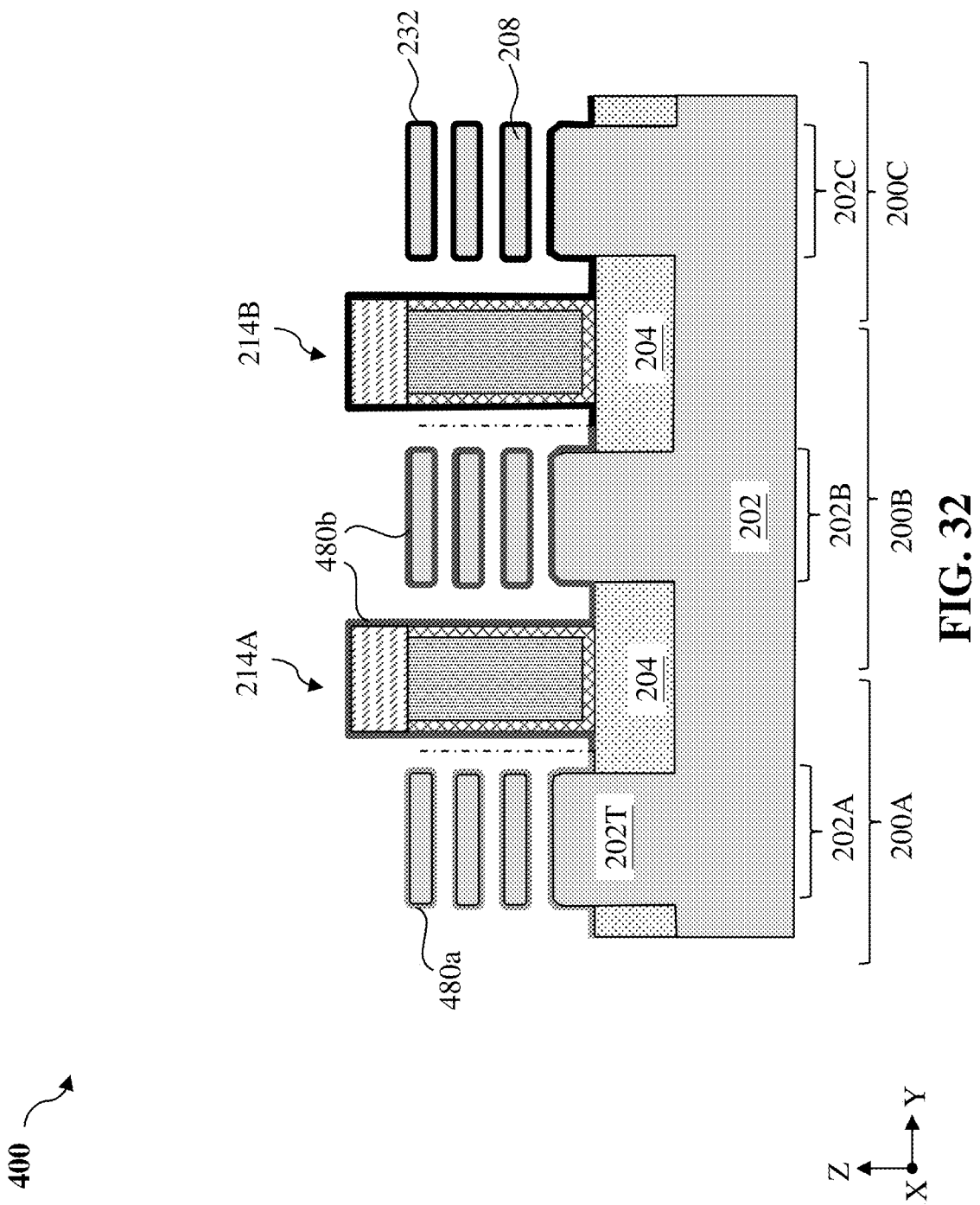

Referring to FIGS. 21, 31 and 32, method 300 includes a block 314 where an annealing process 470 is performed to anneal the workpiece 400. The annealing process 470 is used to thermally drive elements in the first p dipole film 410 and/or the second p dipole film 440 into the portion of the gate dielectric layer 232 disposed directly under the first p dipole film 410 and/or the second p dipole film 440. The first p dipole film 410 and/or the second p dipole film 440 each serves as a diffusion doping vehicle to bring its elements to be in direct contact with the gate dielectric layer 232. More specifically, the annealing process 470 drives elements in the first p dipole film 410 and the second p dipole film 440 into the portion of the gate dielectric layer 232 disposed directly over the portion 202A of the substrate 202 and a portion of the STI feature 204. This portion of the gate dielectric layer 232 after the annealing process 470 may be referred to as a gate dielectric layer 480a (shown in FIG. 32). The annealing process 470 also drives elements in the second p dipole film 440 into the portion of the gate dielectric layer 232 disposed directly over the portion 202B of the substrate 202, a portion of the STI feature 204, and exposed surfaces of the hybrid fin 214A. This portion of the gate dielectric layer 232 after the annealing process 470 may be referred to as a gate dielectric layer 480b (shown in FIG. 32). Because the device region 200C is free of the first p dipole film 410 and the second p dipole film 440, the annealing process 470 does not result in any dipole layer material diffusing into the gate dielectric layer 232 in the device region 200C. An interface between the gate dielectric layer 480a and the gate dielectric layer 480b is disposed directly over the STI feature 204 between the portions 202A and 202B of the substrate 202, and an interface between the gate dielectric layer 480b and the gate dielectric layer 232 is disposed directly over the STI feature 204 between the portions 202B and 202C of the substrate 202.

The annealing process 470 may be in a way similar to the annealing process 242 and may have a high anneal temperature between about 700° C. and about 850° C. so as to allow gallium, zinc, or aluminum in the first p dipole film 410 and/or the second p dipole film 440 to diffuse into the gate dielectric layer 232 in the respective device region. After the annealing process 470, the gate dielectric layer 480a includes the elements (e.g., hafnium) from the gate dielectric layer 232 and also the elements (e.g., gallium and aluminum) from the first p dipole film 410 and the second p dipole film 440, the gate dielectric layer 480b includes the elements (e.g., hafnium) from the gate dielectric layer 232 and also the element (e.g., aluminum) from the second p dipole film 440, and due to lack of any dipole layer, the gate dielectric layer 232 in device region 200C remains substantially unchanged and may be free of elements such as aluminum, gallium, or zinc. For example, the gate dielectric layer 480a may include hafnium, gallium, and aluminum, the gate dielectric layer 480b may include hafnium and aluminum, and is free of gallium, and the gate dielectric layer 232 may include hafnium and is free of gallium and aluminum. In embodiments where the first p dipole film 410 and the second p dipole film 440 are formed of a same material, the concentration of the metal element that diffused into the gate dielectric layer 480a is higher than the that of the gate dielectric layer 480b. For example, when the first p dipole film 410 and the second p dipole film 440 are both formed of gallium oxide, the concentration of gallium in the gate dielectric layer 480a is higher than the concentration of gallium in the gate dielectric layer 480b.

In embodiments represented in FIG. 32, after the annealing process 470, channel members 208 disposed over the portion 202A of the substrate 202 is wrapped around by the gate dielectric layer 480a, channel members 208 disposed over the portion 202B of the substrate 202 is wrapped around by the gate dielectric layer 480b, and channel members 208 disposed over the portion 202C of the substrate 202 is wrapped around by the gate dielectric layer 232. Sidewall and top surfaces of the hybrid fin 214A are covered by the gate dielectric layer 480b, and sidewall and top surfaces of the hybrid fin 214B are covered by the gate dielectric layer 232.

Figure 33:
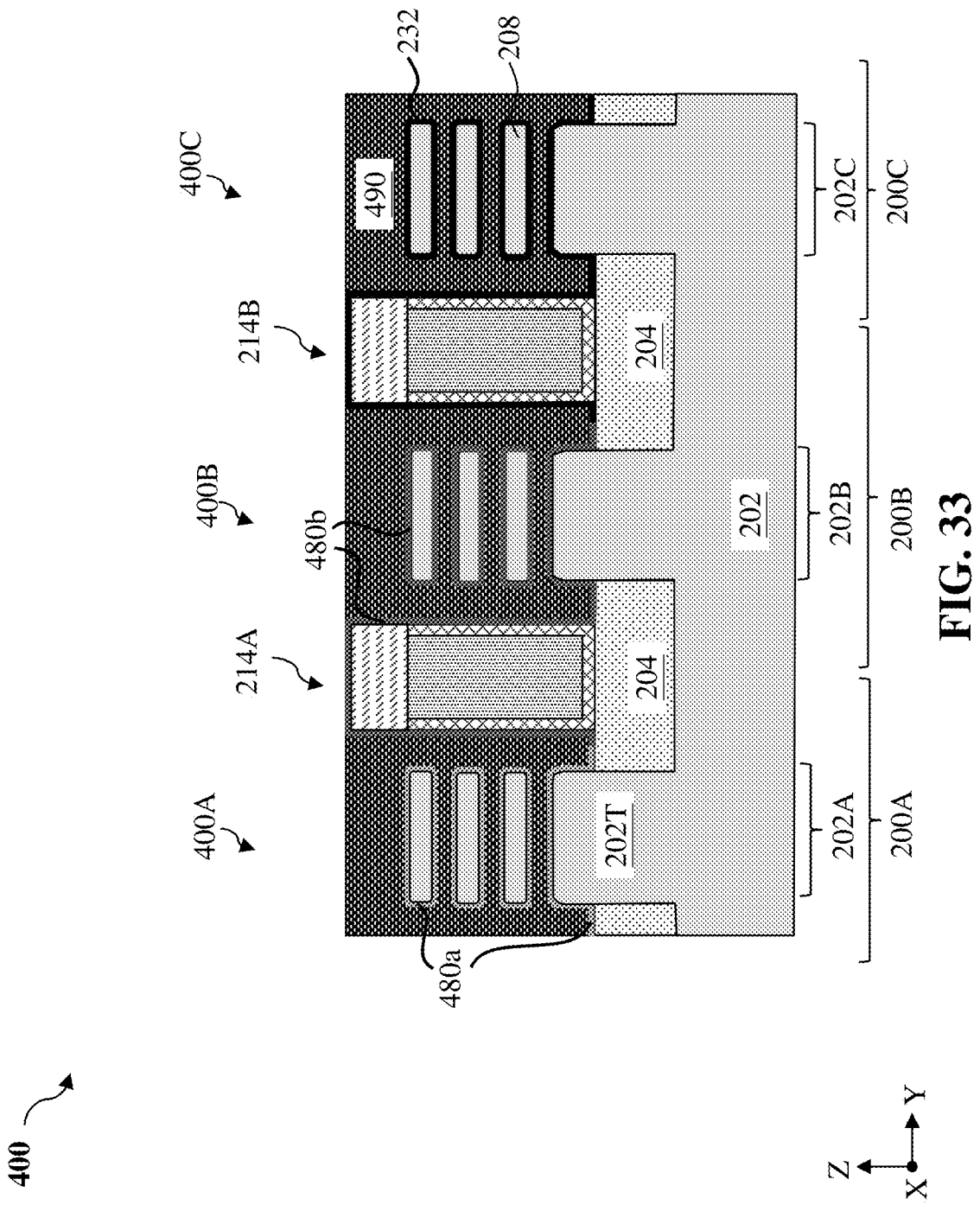

Referring to FIGS. 21 and 32, method 300 includes a block 316 where the first p dipole film 410 and the second p dipole film 440 are selectively removed. After the elements in the first p dipole film 410 and/or the second p dipole film 440 are thermally driven into the gate dielectric layer 232 in the device region 200A and/or the device region 200B, at block 316, the first p dipole film 410 and the second p dipole film 440 are selectively removed from the device regions 200A and 200B. The operations at block 316 may be performed using a dry etch process, a wet etch process, or a suitable etch process. Operations in blocks 122 and 124 of the method 100 may be then applied to the workpiece 400 to finish the fabrication of the semiconductor structure 400. For example, as shown in FIG. 33, one or more conductive layers 490 are formed over the workpiece 400 to finish the fabricate of a metal gate stack over the workpiece 400. The one or more conductive layers 490 may be in a way similar to the conductive layers 244, and repeated descriptions are omitted for reason of simplicity.

Upon conclusion of method 300, a first p-type GAA device 400A, a second p-type GAA device 400B, and a third p-type GAA device 400C are substantially formed. By providing the first p-type GAA device 400A, the second p-type GAA device 400B, and the third p-type GAA device 400C with different gate dielectric layers (i.e., gate dielectric layers 480a, 480b, and 232), the first p-type GAA device 400A, the second p-type GAA device 400B, and the third p-type GAA device 400C would have different threshold voltages.

Although not intended to be limiting, one or more embodiments of the present disclosure provide many benefits to a semiconductor device and the formation thereof. For example, the present disclosure provides methods for forming p-type transistors with different threshold voltages by tuning the elements in corresponding the gate dielectric layers. One or more dipole layers are selectively deposited on a gate dielectric layer and serve as vehicles of diffusion dopants to dope the gate dielectric layer. The gate dielectric layer being doped may have different interface dipoles. The present disclosure provides embodiments to implement two levels of threshold voltages in a semiconductor structure having two device regions and embodiments to implement three levels of threshold voltages in a semiconductor structure having three device regions. In some embodiments, one annealing process may be used to thermally drive elements in the two p dipole films into different device regions to form the three levels of threshold voltages. Transistors having different levels of threshold voltages of the present disclosure may be applied in static random access memory (SRAM) cells, such as 8 T SRAM cells or 10 T SRAM cells, to improve their performance.

The present disclosure provides for many different embodiments. Semiconductor structures and methods of fabrication thereof are disclosed herein. In one exemplary aspect, the present disclosure is directed to a method. The method includes providing a workpiece including a first number of nanostructures over a first region of a substrate, a second number of nanostructures over a second region of the substrate, and a third number of nanostructures over a third region of the substrate, depositing a gate dielectric layer over the workpiece, depositing a first p dipole layer over the gate dielectric layer, selectively removing a second portion of the first p dipole layer directly over the second region and a third portions of the first p dipole layer directly over the second region and the third region of the substrate, thereby leaving a first portion of the first p dipole layer directly over the first region, after the selectively removing of the second and third portions of the first p dipole layer, depositing a second p dipole layer over the workpiece, selectively removing a third portion of the second p dipole layer directly over the third region of the substrate, thereby leaving a first portion of the second p dipole layer directly over the first region and a second portion of the second p dipole layer directly over the second region, after the selective removing of the third portion of the second p dipole layer, annealing the workpiece to drive elements in the first p dipole layer and the second p dipole layer into corresponding portions of the gate dielectric layer thereunder, after the annealing of the workpiece, selectively removing the first portion the first p dipole layer and the first and second portions of the second p dipole layer, and forming a conductive layer over the workpiece.

In some embodiments, the first number of nanostructures may include a first nanostructure vertically spaced apart from a second nanostructure by a spacing S1, wherein the depositing of the gate dielectric layer and the depositing of the first p dipole layer partially fill the spacing S1. In some embodiments, the depositing of the second p dipole layer substantially fills a rest of the spacing S1 such that the spacing S1 is completely filled with the gate dielectric layer, the first p dipole layer, and the second p dipole layer. In some embodiments, the depositing of the second p dipole layer does not completely fill the spacing S1. In some embodiments, the selectively removing the second portion of the first p dipole layer directly over the second region and the third portion directly over the second region and the third region of the substrate may include conformally depositing a hard mask layer, wherein the hard mask layer substantially fills the rest of the spacing S1, forming a patterned bottom anti-reflective coating (BARC) layer over the hard mask layer, the patterned BARC layer exposing the second and third portions of the first p dipole layer directly over the second region and the third region of the substrate, and after the forming of the patterned BARC layer, performing an etching process to the workpiece to remove the second and third portions of the first p dipole layer and portions of the hard mask layer disposed thereon. In some embodiments, the hard mask layer may include titanium nitride. In some embodiments, the workpiece further may include a dielectric fin disposed over a fourth region of the substrate, the fourth region is between the first region and the second region, the dielectric fin may be laterally spaced apart from the first number of nanostructures by a spacing S2, the conformally depositing of the hard mask layer may partially fill the spacing S2. In some embodiments, a composition of the second p dipole layer may be different than a composition of the first p dipole layer.

In another exemplary aspect, the present disclosure is directed to a method. The method includes providing a workpiece comprising a first channel member directly over a first region of a substrate and a second channel member directly over the first channel member, the first channel member being vertically spaced apart from the second channel member by a spacing S1, conformally forming a dielectric layer over the workpiece, conformally depositing a dipole material layer over the dielectric layer, after the depositing of the dipole material layer, performing a thermal treatment process to the workpiece, after the performing of the thermal treatment process, selectively removing the dipole material layer, and forming a gate electrode layer over the dielectric layer.

In some embodiments, the first region of the substrate may include an n-type doped well, the conformal dipole material layer is formed of aluminum oxide, gallium oxide, or zinc oxide. In some embodiments, the workpiece further may include a third channel member directly over a second region of the substrate, and a dielectric feature disposed over the substrate and between the first channel member and the third channel member, the conformally forming of the dielectric layer over the workpiece may include forming the dielectric layer on the dielectric feature, and the conformally depositing of the dipole material layer may include depositing the dipole material layer over the dielectric feature. In some embodiments, the method may include, after the conformally depositing of the dipole material layer, forming a bottom anti-reflective coating (BARC) layer over the workpiece, patterning the BARC layer to form an opening exposing portions of the dipole material layer disposed over the third channel member and a portion of the dielectric feature, selectively removing the portions of the dipole material layer exposed by the opening to expose portions of the dielectric layer thereunder, and before the performing of the thermal treatment process, selectively removing the patterned BARC layer. In some embodiments, before the performing of the thermal treatment process, a portion of the dielectric layer disposed on the first channel member is free of aluminum oxide, zinc oxide, and gallium oxide. After the performing of the thermal treatment process, the portion of the dielectric layer disposed on the first channel member may include aluminum oxide, zinc oxide, or gallium oxide. In some embodiments, the conformally depositing of the dipole material layer may include depositing the dipole material layer to partially fill the spacing S1, and the forming of the BARC layer may include forming the BARC layer to substantially fill a rest of the spacing S1. In some embodiments, the conformally depositing of the dipole material layer may include depositing the dipole material layer to substantially fill the spacing S1. In some embodiments, the patterning of the BARC layer may include forming a patterned mask layer over the BARC layer and over the first channel member, performing an etching process to the workpiece to pattern the BARC layer, and selectively removing the patterned mask layer. After the performing of the etching process, an edge of the patterned BARC layer may be offset from an edge of the patterned mask layer.

In yet another exemplary aspect, the present disclosure is directed to a semiconductor structure. The semiconductor structure includes a first p-type transistor formed over a substrate. The first p-type transistor includes a first active region, a first gate dielectric layer over the first active region, and a first conductive layer disposed over the first gate dielectric layer. The semiconductor structure also includes a second p-type transistor formed over the substrate. The second p-type transistor includes a second active region, a second gate dielectric layer over the second active region, and a second conductive layer disposed over the second gate dielectric layer. The semiconductor structure also includes a third p-type transistor formed over the substrate. The third p-type transistor includes a third active region, a third gate dielectric layer over the third active region, and a third conductive layer disposed over the third gate dielectric layer. A composition of the first gate dielectric layer is different than a composition of the second gate dielectric layer, and the composition of the second gate dielectric layer is different than a composition of the third gate dielectric layer, and a thickness of the first gate dielectric layer may be equal to a thickness of the second gate dielectric layer and a thickness of the third gate dielectric layer.

In some embodiments, a threshold voltage of the first p-type transistor may be different than a threshold voltage of the second p-type transistor, and the threshold voltage of the second p-type transistor may be different than a threshold voltage of the third gate dielectric layer. In some embodiments, the first gate dielectric layer may include first metal element, a second metal element, and a third metal element, the second gate dielectric layer may include the first metal element and the second metal element and is free of the third metal element, and the third gate dielectric layer may include the first metal element and is free of the second metal element and the third metal element. In some embodiments, second metal element may include aluminum, gallium, or zinc.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit-line conductor and word line conductor, one can achieve different resistances for the conductors. However, other techniques to vary the resistances of the metal conductors may also be utilized as well.

What is claimed is:

1. A method, comprising:
   providing a workpiece comprising a first plurality of nanostructures over a first region of a substrate, a second plurality of nanostructures over a second region of the substrate, and a third plurality of nanostructures over a third region of the substrate;
   depositing a gate dielectric layer over the workpiece;
   depositing a first p dipole layer over the gate dielectric layer;
   selectively removing a second portion of the first p dipole layer directly over the second region and a third portion of the first p dipole layer directly over the third region of the substrate, thereby leaving a first portion of the first p dipole layer directly over the first region;
   after the selectively removing of the second and third portions of the first p dipole layer, depositing a second p dipole layer over the workpiece;
   selectively removing a third portion of the second p dipole layer directly over the third region of the substrate, thereby leaving a first portion of the second p dipole layer directly over the first region and a second portion of the second p dipole layer directly over the second region;
   after the selective removing of the third portion of the second p dipole layer, annealing the workpiece to drive elements in the first p dipole layer and the second p dipole layer into corresponding portions of the gate dielectric layer thereunder;
   after the annealing of the workpiece, selectively removing the first portion the first p dipole layer and the first and second portions of the second p dipole layer; and
   forming a conductive layer over the workpiece.

2. The method of claim 1, wherein the first plurality of nanostructures comprises a first nanostructure vertically spaced apart from a second nanostructure by a spacing S1, wherein the depositing of the gate dielectric layer and the depositing of the first p dipole layer partially fill the spacing S1.

3. The method of claim 2, wherein the depositing of the second p dipole layer fills a remaining portion of the spacing S1 such that the spacing S1 is completely filled with the gate dielectric layer, the first p dipole layer, and the second p dipole layer.

4. The method of claim 2, wherein the depositing of the second p dipole layer does not completely fill the spacing S1.

5. The method of claim 4, wherein the selectively removing the second portion of the first p dipole layer directly over the second region and the third portion directly over the third region of the substrate comprises:
   conformally depositing a hard mask layer, wherein the hard mask layer fills a remaining portion of the spacing S1;
   forming a patterned bottom anti-reflective coating (BARC) layer over the hard mask layer, the patterned BARC layer exposing the second and third portions of the first p dipole layer directly over the second region and the third region of the substrate; and
   after the forming of the patterned BARC layer, performing an etching process to the workpiece to remove the second and third portions of the first p dipole layer and portions of the hard mask layer disposed thereon.

6. The method of claim 5, wherein the hard mask layer comprises titanium nitride.

7. The method of claim 5,
   wherein the workpiece further comprises a dielectric fin disposed over a fourth region of the substrate, the fourth region is between the first region and the second region,
   wherein the dielectric fin is laterally spaced apart from the first plurality of nanostructures by a spacing S2, and
   wherein the conformally depositing of the hard mask layer partially fills the spacing S2.

8. The method of claim 1, wherein a composition of the second p dipole layer is different than a composition of the first p dipole layer.

9. A method, comprising:
   providing a workpiece comprising:
      a first channel member directly over a first region of a substrate and a second channel member directly over the first channel member, the first channel member being vertically spaced apart from the second channel member by a spacing S1,
      a third channel member directly over a second region of the substrate, and
      a dielectric feature disposed over the substrate and between the first channel member and the third channel member;
   conformally forming a dielectric layer over the workpiece;
   conformally depositing a dipole material layer over the dielectric layer;
   forming a bottom anti-reflective coating (BARC) layer over the dipole material layer;
   by using a mask layer, patterning the BARC layer to form an opening exposing portions of the dipole material layer disposed over the third channel member, wherein an edge of the patterned BARC layer is offset from an edge of the mask layer;
   removing portions of the dipole material layer exposed by the opening of the patterned BARC layer;
   after the removing, performing a thermal treatment process to the workpiece;
   after the performing of the thermal treatment process, selectively removing a remaining portion of the dipole material layer; and
   forming a gate electrode layer over the dielectric layer.

10. The method of claim 9, wherein the first region of the substrate comprises an n-type doped well, the dipole material layer is formed of aluminum oxide, gallium oxide, or zinc oxide.

11. The method of claim 9, further comprising:
before the performing of the thermal treatment process, selectively removing the patterned BARC layer.

12. The method of claim 11,
wherein, before the performing of the thermal treatment process, a portion of the dielectric layer disposed on the first channel member is free of aluminum oxide, zinc oxide, and gallium oxide, and
wherein, after the performing of the thermal treatment process, the portion of the dielectric layer disposed on the first channel member comprises aluminum oxide, zinc oxide, or gallium oxide.

13. The method of claim 11,
wherein the conformally depositing of the dipole material layer comprises depositing the dipole material layer to partially fill the spacing S1, and
wherein the forming of the BARC layer comprises forming the BARC layer to fill a rest of the spacing S1.

14. The method of claim 11, wherein the conformally depositing of the dipole material layer comprises depositing the dipole material layer to fill the spacing S1.

15. The method of claim 11, further comprising:
after the patterning of the BARC layer, selectively removing the mask layer.

16. A method, comprising:
forming a first plurality of nanostructures over a first portion of a substrate;
forming a second plurality of nanostructures over a second portion of the substrate;
forming a dielectric structure disposed between the first plurality of nanostructures and the second plurality of nanostructures, the dielectric structure comprising a first sidewall surface, a second sidewall surface opposite the first sidewall surface, and a top surface extending between the first sidewall surface and the second sidewall surface;
forming a gate dielectric layer over the substrate, wherein the gate dielectric layer comprises a first portion wrapping around the first plurality of nanostructures and extending along the first sidewall surface and a part of the top surface and a second portion wrapping around the second plurality of nanostructures and extending along the second sidewall surface and a remaining part of the top surface;
performing a treatment to introduce metal elements into the first portion of the gate dielectric layer, wherein, after the performing of the treatment, a concentration of the metal elements in the first portion of the gate dielectric layer is greater than a concentration of the metal elements in the second portion of the gate dielectric layer, and an interface between the first portion of the gate dielectric layer and the second portion of the gate dielectric layer is offset from a center line of the dielectric structure; and
after the performing of the treatment, forming a gate electrode over the gate dielectric layer.

17. The method of claim 16, wherein the metal elements comprise aluminum, zinc, or gallium.

18. The method of claim 16, wherein the gate electrode comprises a p-type work function metal layer.

19. The method of claim 16, wherein the gate dielectric layer comprises an interfacial layer and a high-k dielectric layer extending over the interfacial layer.

20. The method of claim 16, wherein the performing of the treatment comprises:
forming a dipole layer on the first portion of the gate dielectric layer;
after the forming of the dipole layer, performing a thermal treatment to the dipole layer; and
selectively removing the dipole layer after the performing of the thermal treatment.

* * * * *